(12) United States Patent
Ikegawa et al.

(10) Patent No.: US 10,622,552 B2
(45) Date of Patent: Apr. 14, 2020

(54) MAGNETORESISTIVE STACKS AND METHODS THEREFOR

(71) Applicant: Everspin Technologies Inc., Chandler, AZ (US)

(72) Inventors: Sumio Ikegawa, Phoenix, AZ (US); Jon Slaughter, Albany, NY (US); Renu Whig, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/179,112

(22) Filed: Nov. 2, 2018

(65) Prior Publication Data

US 2019/0131519 A1 May 2, 2019

Related U.S. Application Data

(60) Provisional application No. 62/580,612, filed on Nov. 2, 2017.

(51) Int. Cl.

| | |
|---|---|
| *H01L 43/10* | (2006.01) |
| *H01L 27/22* | (2006.01) |
| *H01L 43/02* | (2006.01) |
| *H01F 10/32* | (2006.01) |
| *H01F 41/32* | (2006.01) |
| *G11C 11/16* | (2006.01) |
| *H01L 43/12* | (2006.01) |
| *H01L 43/08* | (2006.01) |
| *H01F 10/30* | (2006.01) |

(52) U.S. Cl.
CPC ............ *H01L 43/10* (2013.01); *G11C 11/161* (2013.01); *H01F 10/30* (2013.01); *H01F 10/329* (2013.01); *H01F 10/3254* (2013.01); *H01F 10/3272* (2013.01); *H01F 10/3286* (2013.01); *H01F 41/32* (2013.01); *H01L 27/228* (2013.01); *H01L 43/02* (2013.01); *H01L 43/08* (2013.01); *H01L 43/12* (2013.01)

(58) Field of Classification Search
CPC ......... H01L 43/10; H01L 43/02; H01L 43/12; H01L 27/228; G11C 11/161; H01F 41/32; H01F 10/3254; H01F 10/3272; H01F 10/3286; H01F 10/329
USPC ....................................................... 257/421
See application file for complete search history.

(56) References Cited

U.S. PATENT DOCUMENTS

| | | |
|---|---|---|
| 8,422,176 B1 | 4/2013 | Leng et al. |
| 8,686,484 B2 | 4/2014 | Whig et al. |

(Continued)

FOREIGN PATENT DOCUMENTS

WO   WO 2017/052635   3/2017

OTHER PUBLICATIONS

International Search Report issued in International Application No. PCT/US2018/058935, dated Mar. 6, 2019 (12 pages).

(Continued)

*Primary Examiner* — Tu-Tu V Ho
(74) *Attorney, Agent, or Firm* — Bookoff McAndrews, PLLC

(57) ABSTRACT

A magnetoresistive stack includes a seed region formed above a base region, a fixed magnetic region formed above the seed region and an intermediate region positioned between the fixed magnetic region and a free magnetic region. The base region may be formed of a material having a lower standard free energy of oxidation than iron.

18 Claims, 10 Drawing Sheets

(56) References Cited

U.S. PATENT DOCUMENTS

| | | | |
|---|---|---|---|
| 9,136,464 B1 | 9/2015 | Whig et al. | |
| 2004/0201929 A1* | 10/2004 | Hashimoto | G11B 5/3906 |
| | | | 360/324.1 |
| 2006/0034022 A1 | 2/2006 | Fukuzawa et al. | |
| 2008/0171223 A1 | 7/2008 | Wang et al. | |
| 2008/0239591 A1* | 10/2008 | Fuji | B82Y 10/00 |
| | | | 360/324.12 |
| 2012/0205758 A1 | 8/2012 | Jan et al. | |
| 2015/0069554 A1 | 3/2015 | Nakayama et al. | |
| 2017/0148977 A1 | 5/2017 | Zhu et al. | |
| 2017/0170388 A1 | 6/2017 | Whig et al. | |
| 2018/0130943 A1* | 5/2018 | Naik | H01F 10/3254 |

OTHER PUBLICATIONS

G.S. Kar et al., "Co/Ni based p-MTJ stack for sub-20nm high density stand alone and high performance embedded memory application", Dec. 2014, p. 1-4, IEEE International Electron Devices Meetings, San Francisco, CA (4 pages).

* cited by examiner

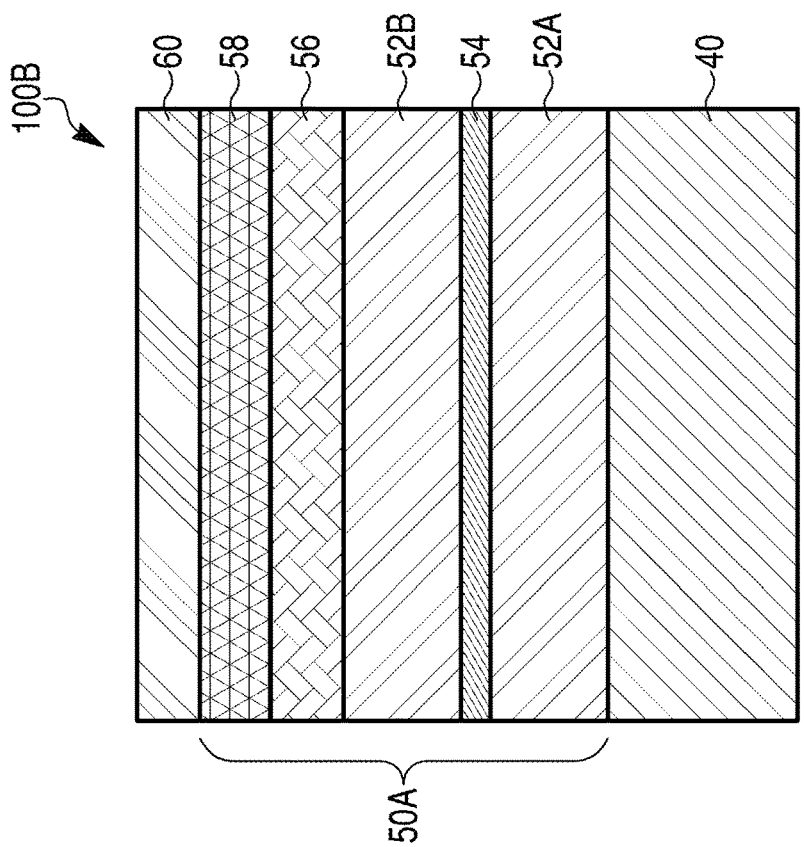
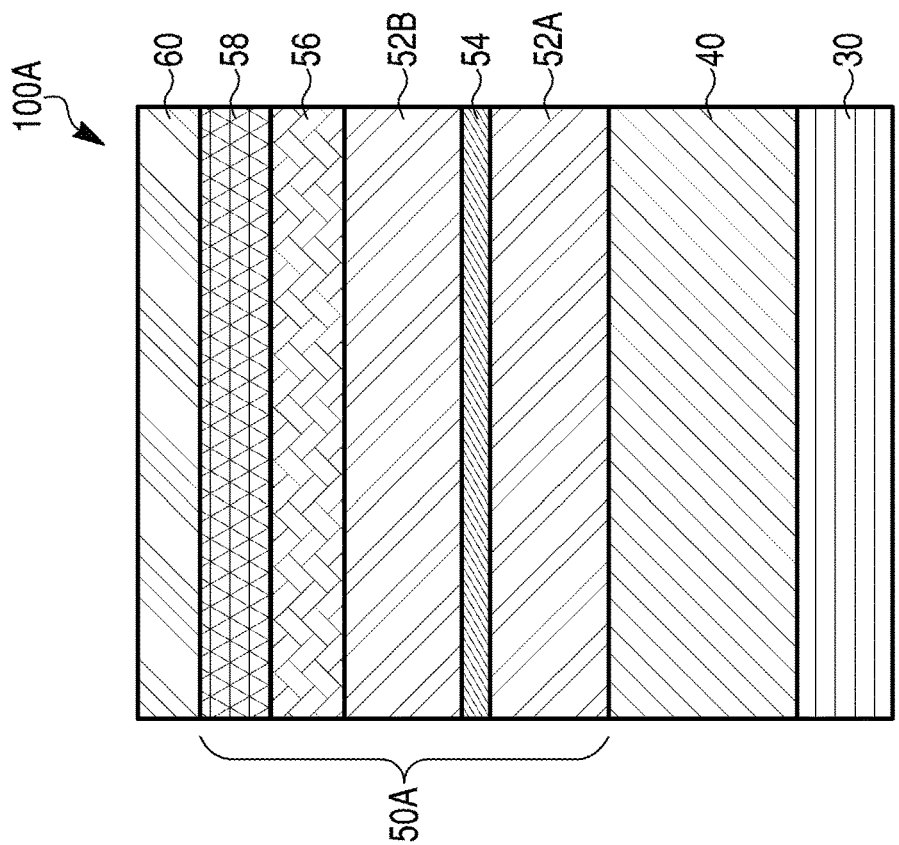
FIG. 4B
FIG. 4A

MAGNETORESISTIVE STACKS AND METHODS THEREFOR

CROSS-REFERENCE TO RELATED APPLICATIONS

This application claims the benefit of priority from U.S. Provisional Application No. 62/580,612, filed on Nov. 2, 2017, which is incorporated by reference herein in its entirety.

INTRODUCTION

There are many inventions described and illustrated herein, as well as many aspects and embodiments of those inventions. In one aspect, the present inventions relate to a magnetoresistive stack/structure (for example, a magnetoresistive memory stack/structure or a magnetoresistive sensor/transducer stack/structure) and a method of manufacturing such a stack/structure. In one embodiment of this aspect of the invention, the inventive magnetoresistive stack/structure (for example, a magnetic tunnel junction (MTJ) stack/structure) includes an amorphous alloy region (for example, an alloy including iron, cobalt and/or boron—e.g., an iron boron alloy wherein the concentration of boron is greater than or equal to 40% or 45% and preferably greater than or equal to 50% (+/−10%)) disposed between a seed region and an electrically conductive material (for example, a metal of an electrode/via/line). In this structure, the amorphous alloy region may retard, suppress or reduce the columnar growth of the seed region.

Notably, the seed region may include one or more of nickel, chromium, cobalt, iron and alloys thereof (for example, an alloy including nickel and chromium) having a thickness which is greater than or equal to 30 Angstroms, or 40 Angstroms, or 50 Angstroms, or preferably greater than or equal to 60 Angstroms, or more preferably greater than or equal to 40 or 50 Angstroms and less than or equal to 100 Angstroms (for example, 40 Angstroms to 60 Angstroms), or even more preferably greater than or equal to 60 Angstroms and less than or equal to 100 Angstroms+/−10% (see, for example, U.S. patent application Ser. No. 15/373,880, which is incorporated herein by reference). The seed region may be disposed in physical contact with amorphous alloy region, which may be in physical contact with an electrically conductive metal material of an electrode/via/line (for example, in the context of an electrode or via, tantalum, or an alloy thereof (such as a tantalum-nitride alloy), or a composite thereof (such as a tantalum and tantalum-nitride alloy composite)). The seed region, in one embodiment, is in contact with a fixed magnetic region including a plurality of layers of one or more magnetic or ferromagnetic materials (for example, a multi-layer structure of (i) cobalt and platinum or (ii) cobalt and nickel)).

In one embodiment, the amorphous alloy region is implemented in a MTJ-type magnetoresistive stack/structure having a perpendicular magnetic anisotropy wherein the magnetic region disposed on or in physical contact with the seed region maintains or includes improved properties (for example, magnetoresistance (MR) and resistance-area product (RA) of the stack/structure) after subsequent or additional processing (for example, annealing processes after deposition/formation of the magnetic region). Indeed, a stack/structure including such a seed region may exhibit improved reliability, thermal stability and/or thermal endurance of the magnetoresistive stack/structure, for example, a magnetoresistive memory stack/structure. Here, the amorphous alloy region of the present inventions may facilitate growth thereon of a nickel-chrome seed region having reduced or suppressed columnar characteristics (relative to conventional seed regions and/or seed regions grown on the aforementioned electrically conductive metal material).

Notably, the present inventions may employ any technique now known or later developed to manufacture the MTJ stack/structure including with respect to the formation and/or deposition of the amorphous alloy region; all such techniques are intended to fall within the scope of the present inventions. For example, in one embodiment, the amorphous alloy region is iron and boron and is formed or deposited, via ion-beam deposition, sputtering and/or evaporation techniques, on an electrically conductive metal of, for example, an electrode/via/line (for example, a metal material such as tantalum or tantalum-nitride, or a composite thereof). Thereafter, the seed region may be formed and then one or more layers of ferromagnetic material (for example, a multi-layer structure of (i) cobalt and platinum or (ii) cobalt and nickel) may be deposited on the seed region.

In addition thereto, or in lieu thereof, the inventive magnetoresistive element may also include, in one embodiment, a fixed magnetic region including multi-layer SAF structure (AP1 and AP2) and a transition layer and reference layer disposed between AP2 and a dielectric layer(s) wherein the transition layer and/or the reference layer is an iron and boron alloy. In one embodiment, the transition layer is an iron boron alloy wherein the concentration of boron provides a weakly or non-magnetic or non-ferromagnetic layer (for example, the concentration of boron is greater than or equal to 40% or 45% and preferably greater than or equal to 50%). In another embodiment, the reference layer includes cobalt, iron, cobalt and iron (e.g., as an alloy or multilayer). In yet another embodiment, the reference layer may also include boron or tantalum (as an alloy or multilayer). For example, in one embodiment, the reference layer is an alloy of iron and boron which is ferromagnetic (for example, the concentration of iron is greater than or equal to 50% (+/−10%) and/or the concentration of boron is less than or equal to 40% (+/−10%) and preferable less than or equal to 30% (+/−10%)).

Notably, the reference layer and/or transition layer according to certain embodiments of the inventions, may include one or more layers of material that facilitate/improve growth of the dielectric layer (which is a tunnel barrier in the MTJ structure) during fabrication; in one embodiment, the reference layer may include a layer of iron (for example, deposited as pure or substantially pure iron) and a layer of cobalt, iron and boron (for example, deposited as an alloy) wherein, after further/final processing (e.g., after annealing), the layer of iron at the interface may form a continuous atomic layer or may mix with the underlying ferromagnetic alloy in the final annealed structure, resulting in a high-iron interface region (e.g., iron having a concentration of greater than or equal to 50%) within the reference layer which is adjacent to the dielectric layer.

Briefly, a magnetoresistive memory stack/structure, in one embodiment, includes at least one non-magnetic layer (for example, at least one dielectric layer) disposed between a "fixed" magnetic region and a "free" magnetic region, each consisting of a plurality of layers of one or more magnetic or ferromagnetic materials. Information is stored in the magnetoresistive memory stack/structure by switching, programming and/or controlling the direction of magnetization vectors in one or more of the magnetic layers of the free magnetic or storage region of the stack/structure. Here, the direction of the magnetization vectors of the free magnetic region may be switched and/or programmed (for example, through spin-torque transfer) by application of a write signal (one or more current pulses) to or through the magnetoresistive memory stack/structure while, in contrast, the magnetization vectors in the magnetic layers of a fixed magnetic region are magnetically fixed (in a predetermined direction).

The magnetoresistive memory stack/structure includes an electrical resistance that depends on the magnetic state of certain regions of the memory stack/structure. That is, in one embodiment, when the magnetization vectors of the "free" magnetic region are in a first state or in a first direction (for example, which is the same direction as the direction of the magnetization vectors of the "fixed" magnetic region), the magnetoresistive memory stack/structure has a first magnetic state which may correspond to a low electrical resistance state. Conversely, when the magnetization vectors of the "free" magnetic region are in a second state or in a second direction (for example, which is a different direction (for example, opposite or opposing) as the direction of the magnetization vectors of the "fixed" magnetic region), the magnetoresistive memory stack/structure has a second magnetic state which may correspond to a high electrical resistance state. The magnetic state of the magnetoresistive memory stack/structure is determined or read based on the resistance of the magnetoresistive memory stack/structure in response to a read current of a read operation.

The present inventions are also directed to magnetoresistive integrated circuit devices (for example, a spin-torque MRAM) having one or more magnetoresistive stacks/structures (for example, a plurality of MTJ stacks/structures of a MTJ-based sensor/transducer device and/or MTJ-based memory device). In one embodiment, the MTJ stacks/structures possess/include a perpendicular magnetic anisotropy wherein the magnetic region disposed on or in physical contact with the inventive seed region maintains or includes improved properties or characteristics (for example, magnetoresistance (MR) and resistance-area product (RA) of the stack/structure) after processing (for example, one or more annealing processes after deposition/formation of the magnetic region). Indeed, a magnetoresistive stack/structure including such an amorphous alloy region may promote growth or formation of a less columnar seed region which may be more reliable and thermally stable and/or provide greater thermal endurance.

Notably, although certain exemplary embodiments are described and/or illustrated herein in the context of MTJ stacks/structures, the present inventions may be implemented in giant magnetoresistive (GMR) stacks/structures where a conductor is disposed between two ferromagnetic materials. Indeed, the present inventions may be employed in connection with other types of magnetoresistive stacks/structures wherein such stacks/structures include an amorphous alloy region (e.g., an iron-boron alloy wherein the boron is greater than or equal to 40% or 45% and preferably greater than or equal to 50%) which is disposed between and in contact with a seed region and an electrically conductive electrode/via/line. For the sake of brevity, the discussions and illustrations will not be repeated specifically in the context of GMR or other magnetoresistive stacks/structures—but such discussions and illustrations are to be interpreted as being entirely applicable to GMR and other stacks/structures.

BRIEF DESCRIPTION OF THE DRAWINGS

The present inventions may be implemented in connection with embodiments illustrated in the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIGS. 4A and 4B illustrate cross-sectional views of exemplary "fixed" magnetic regions of the magnetoresistive stack/structure of FIG. 1;

Figure 1:
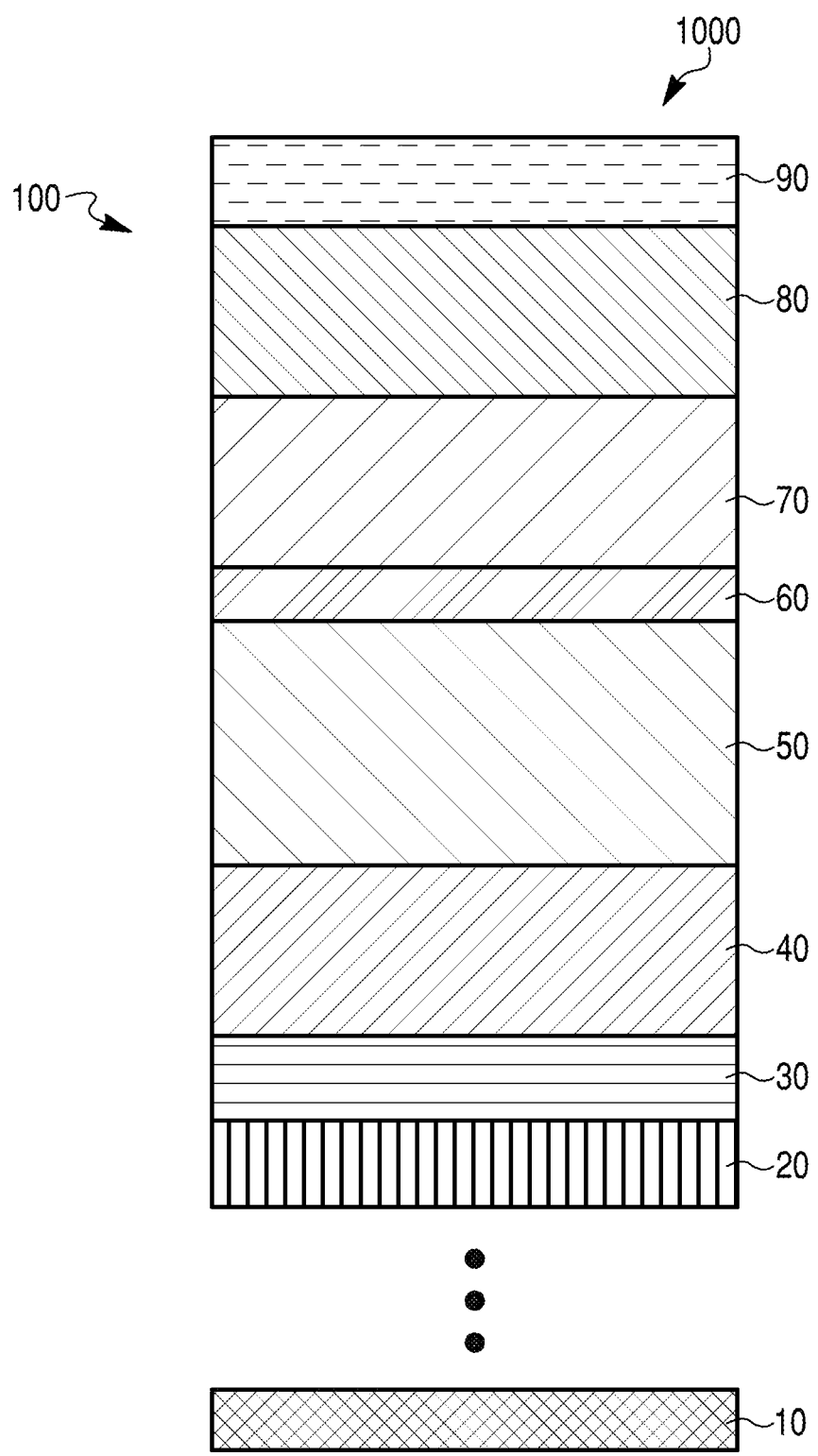
FIG. 1 illustrates a cross-sectional view of an exemplary MTJ-type magnetoresistive stack/structure of the current disclosure.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

Moreover, many other aspects, inventions and embodiments, which may be different from and/or similar to, the aspects, inventions and embodiments illustrated in the drawings, will be apparent from the description and illustrations, which follow. In addition, although various features and attributes have been illustrated in the drawings and/or are apparent in light thereof, it should be understood that such features and attributes, and advantages thereof, are not required whether in one, some or all of the embodiments of the present inventions and, indeed, need not be present in any of the embodiments of the present inventions.

Although the figures (e.g., FIGS. 1, 4A, 4B, 6A, 6B, etc.) illustrate a magnetoresistive stack as comprising different distinct regions or layers, this is only a simplification. For example, although the different regions may be sequentially and individually formed during fabrication, as would be recognized by those of ordinary skill in the art, the materials that make up the various regions may alloy with (e.g., intermix with, diffuse into, etc.) the materials of adjacent regions during subsequent processing (e.g., high temperature processing operations, such as, annealing, etc.). Therefore, a person skilled in the art would recognize that, although the different regions may appear as separate regions with distinct interfaces immediately after formation of these regions, after subsequent processing operations, the materials of the different regions may alloy together to form a single alloyed region having a higher concentration of different materials at interfaces between different regions. Thus, in some cases, it may be difficult to distinguish the different regions of an illustrated magnetoresistive stack visually without physical or chemical analysis.

Notably, for simplicity and clarity of illustration, certain aspects of the figures depict the general structure and/or manner of construction of the various embodiments. Descriptions and details of well-known features and techniques may be omitted to avoid unnecessarily obscuring other features. Elements in the figures are not necessarily drawn to scale; the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" and gradually sloping.

DETAILED DESCRIPTION

The following description is merely illustrative and is not intended to limit the described embodiments and their uses. Any embodiment or implementation described herein as exemplary is not necessarily to be construed as preferred or advantageous over other implementations. Rather it is intended or used in the sense of an "example" rather than "ideal" or "preferred" or "advantageous" relative to other implementations or embodiments.

Further, the terms "comprise," "include," "have" and any variations thereof are used synonymously to denote or describe non-exclusive inclusion. As such, a process, method, article, or apparatus that uses such terms does not include only those steps, structure or elements but may include other steps, structures or elements not expressly listed or inherent to such process, method, article, or apparatus. In addition, the terms "top," "bottom," "first," "second," and the like, herein do not denote any order, quantity, or importance, but rather are used to distinguish an element, a structure, a step or a process from another. Moreover, the terms "a" and "an" herein do not denote a limitation of quantity, but rather denote the presence of at least one of the referenced item.

It should be noted that all numeric values disclosed herein (including all disclosed thickness values, limits, and ranges) may have a variation of ±10% (unless a different variation is specified) from the disclosed numeric value. For example, a material described as having a boron concentration of 50% may actually have a boron concentration between 45-55%. Also, all percentage concentrations described herein refer to atomic percent (or at. %). For example, boron concentration of 50% refers to the concentration of boron by atomic percent (i.e., percentage of boron atoms relative to the total number of atoms). Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range±10%. It should be noted that the exemplary thickness values discussed in this disclosure are expected values (i.e., not measured values) of layer thicknesses immediately after deposition (based on deposition conditions, etc.). As a person of ordinary skill in the art would recognize, these as-deposited thickness values of a layer or region may change (e.g., by inter-layer diffusion, etc.) after further processing (e.g., exposure to high temperatures, etc.).

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, some of the regions and/or layers of the disclosed magnetoresistive stacks are referred to by specific names (spacer region, reference region, transition region, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the free region is depicted as being above an intermediate region, in some aspects the entire magnetoresistive stack may be flipped such that the intermediate region is above the free region.

All patents, applications, published applications and other publications referred to herein are incorporated by reference in their entirety. Unless defined otherwise, all terms of art, notations and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. If a definition or description set forth in this disclosure is contrary to, or otherwise inconsistent with, a definition and/or description in these references, the definition and/or description set forth in this disclosure prevails over those in the references that are incorporated herein by reference. None of the references described or referenced herein is admitted to be prior art to the current disclosure.

In one aspect, the present disclosure relate to a magnetoresistive stack/structure (for example, a magnetoresistive memory stack/structure or a magnetoresistive sensor/transducer stack/structure) and a method of manufacturing such a stack/structure. In one embodiment, the disclosed magnetoresistive stack/structure (for example, a magnetic tunnel junction (MTJ) stack/structure) includes an amorphous alloy region (for example, an alloy including iron, cobalt and/or boron—e.g., an iron boron alloy wherein the concentration of boron is greater than or equal to 40% or 45% and preferably greater than or equal to 50% (+/−10%)) disposed between a seed region and an electrically conductive material (for example, a metal of an electrode/via/line). In this structure, the amorphous alloy region may retard, suppress or reduce the columnar growth of the seed region.

In addition thereto, or in lieu thereof, the disclosed magnetoresistive element may also include, in one embodiment, a fixed magnetic region including multi-layer SAF structure (AP1 and AP2) and a transition layer and reference layer disposed between AP2 and a dielectric layer(s) wherein the transition layer and/or the reference layer is an iron and boron alloy. In one embodiment, the transition layer is an iron boron alloy wherein the concentration of boron provides a weakly or non-magnetic or non-ferromagnetic layer (for example, the concentration of boron is greater than or equal to 40% or 45% and preferably greater than or equal to 50%). In another embodiment, the reference layer includes cobalt, iron, cobalt and iron (e.g., as an alloy or multilayer). In yet another embodiment, the reference layer may also include boron or tantalum (as an alloy or multilayer). For example, in one embodiment, the reference layer is an alloy of iron and boron which is ferromagnetic (for example, the concentration of iron is greater than or equal to 50% and preferably greater than or equal to 75% atomic weight).

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be employed/applied whereby the layer not protected by the remaining resist is patterned. Alternatively, an additive process can be used in which a structure is built up using the photoresist as a template.

As noted above, in one aspect, the described embodiments relate to, among other things, methods of manufacturing a magnetoresistive stack/structure having one or more electrically conductive electrodes, vias or conductors on either side of a magnetic material stack. As described in further detail below, the magnetic material stack may include many different layers of material, where some of the layers include magnetic materials, whereas others do not. In one embodiment, the methods of manufacturing include sequentially depositing, growing, sputtering, evaporating and/or providing (as noted above, hereinafter collectively "depositing" or other verb tense (e.g., "deposit" or "deposited")) layers and regions which, after further processing (for example, etching) those layers form a magnetoresistive stack/structure.

The magnetoresistive structures/stacks of the present inventions may be formed between electrically conductive material of, for example, a top electrode/via/line and a bottom electrode/via/line, which permit access to the stack/structure by allowing for connectivity to circuitry and other elements of the magnetoresistive device. Between electrically conductive material of, for example, the electrodes/vias/lines, are layers and/or regions, including at least one fixed magnetic region (which includes, among other things, a plurality of ferromagnetic layers), a seed region, which in at least one embodiment is disposed between the electrically conductive electrode/via/line, at least one free magnetic region (which includes, among other things, a plurality of ferromagnetic layers), and one or more dielectric layers or regions (hereinafter collectively, "dielectric layer")—including at least one dielectric layer, disposed between a fixed magnetic region and the free magnetic region, to provide a tunnel barrier layer therebetween.

FIG. 1 illustrates a cross-sectional view of an exemplary magnetoresistive device 1000 of the current disclosure having an exemplary magnetic tunnel junction (MTJ) type magnetoresistive stack/structure 100. For the sake of brevity, magnetoresistive stack/structure 100 will be referred to as magnetoresistive stack 100. Magnetoresistive stack 100 may be, for example, an in-plane or out-of-plane (e.g., perpendicular) magnetic anisotropy magnetoresistive structure. Although not shown in FIG. 1, magnetoresistive stack 100 may be coupled or otherwise connected to an access transistor (or other suitable select devices, such as, e.g., a diode) and to various conductors (e.g., source line conductor, word line conductor, bit line conductor, etc.) formed on a semiconductor substrate 10. These conductors may carry one or more control signals and provide access to magnetoresistive bits (MTJ bits) formed from magnetoresistive stack 100.

Magnetoresistive stack 100 includes a plurality of regions (made of one or more layers) stacked one above the other. These stacked regions include an intermediate region 60 disposed between a "free" magnetic region 70 (or storage region) and a "fixed" magnetic region 50. In an MTJ device, intermediate region 60 may be a tunnel barrier and may include an insulating material, such as, e.g., a dielectric material. In some embodiments, intermediate region 60 may include one or more dielectric layers, such as, for example, one or more layers of aluminum oxide ($Al_xO_y$) and/or magnesium oxide (MgO). However, in a giant magnetoresistance (GMR) type device, intermediate region 60 may be a conductive material (e.g., copper, gold, or alloys thereof).

"Free" magnetic region 70 is a ferromagnetic region in which the magnetic moment shifts or moves significantly in response to an applied magnetic fields or a spin-polarized current. In contrast, "fixed" magnetic region 50 is a ferromagnetic region in which the magnetic moment vector does not move substantially in response to the applied magnetic fields or spin-polarized currents used to switch the magnetic moment vector in "free" magnetic region 70. For the sake of brevity, in the discussion below, "free" magnetic region 70 will be referred to as free region 70, and "fixed" magnetic region 50 will be referred to as fixed region 50. The direction of the magnetization vectors of the free region 70 may be switched and/or programmed (for example, through spin transfer torque (STT), spin orbit torque (SOT), or a magnetic field generated by electrical current passing through a nearby conductor) by application of a write signal (e.g., one or more current pulses) to the magnetoresistive stack 100.

With continuing reference to FIG. 1, magnetoresistive stack 100 may be formed between a first electrode 20 (or an electrically conductive via or line) and a second electrode 90 (or an electrically conductive via or line). First and second electrodes 20, 90 may comprise an electrically conductive material, and may be part of (or be in physical contact with) electrically conductive interconnects (e.g., vias, traces, lines, etc.) of an MTJ device formed using magnetoresistive stack 100. Although any electrically conductive material may be used for first and second electrodes 20, 90, in some embodiments, a metal such as tantalum (Ta), titanium (Ti), tungsten (W), or a composite or alloy of these elements (e.g., tantalum-nitride alloy or composite) may be used. In some embodiments, first and/or second electrodes 20, 90 may be eliminated, and magnetoresistive stack 100 may be in direct contact with a metallization structure (e.g., line, via, etc.) of the MTJ device.

As is known in the art, an electrical resistance of the magnetoresistive stack 100 may change based on whether the magnetization direction (e.g., the direction of the magnetic moment) of the free region 70 is in a parallel alignment (P) or in an antiparallel alignment (AP) with the magnetization direction of the fixed region 50. Typically, if the two regions have the same magnetization alignment (i.e., in the P magnetic state), the resulting relatively low(er) resistance (RL) is considered as a digital "0," while if the alignment is antiparallel (i.e., in the AP state) the resulting relatively high(er) resistance (RH) is considered to be a digital "1." A memory device (such as an MRAM) may include multiple magnetoresistive stacks 100, which may be referred to as memory cells or elements, arranged in an array of columns and rows. By measuring the current through each cell, the resistance of each cell, and thus the data stored in the memory array can be "read." Magnetoresistance ratio (MR) is the ratio of the change in resistance of a magnetoresistive stack between its high and low resistance states (MR=(RH−RL)/RL, where RL and RH are the resistance of the magnetoresistive stack in the low and high resistance states, respectively. MR is indicative of the strength of the signal when a memory element is "read." For an MTJ-type magnetoresistive stack with a strong read signal, a larger MR (e.g., a larger difference between the individual resistances RH and RL) is desirable. When intermediate region 60 of magnetoresistive stack 100 is a tunnel barrier made of a dielectric material, the resistance may be measured by the resistance-area product (RA).

With reference to FIG. 1, in some embodiments, fixed region 50 is disposed on a seed region 40. During fabrication of magnetoresistive stack 100, seed region 40 may assist in the formation of the overlying fixed region 50. In general, seed region 40 may include one or more of nickel (Ni), chromium (Cr), cobalt (Co), iron (Fe), ruthenium (Ru), platinum (Pt), tantalum (Ta), and alloys thereof (for example, an alloy including nickel (Ni) and/or chromium (Cr)). In some embodiments, seed region 40 may include a nickel alloy (Ni-alloy), an iron alloy (Fe-alloy), a cobalt (Co-alloy), and/or a chromium alloy (Cr-alloy) such as, for example, nickel-chromium (NiCr). In some embodiments, seed region 40 have a thickness greater than or equal to about 30 Angstroms (Å), such as, for example, 40 Å. In some embodiments, seed region 40 may be eliminated.

In some embodiments, seed region 40 may be disposed or formed on a base region 30 which is disposed, or formed, on first electrode 20. In some embodiments, base region 30 may include iron and boron, for example, an alloy of iron and boron (referred to hereinafter as an FeB alloy). In some embodiments, the concentration of boron in the FeB alloy may be greater than or equal to 40%, greater than or equal to 45%, or greater than or equal to 50% (i.e., B≥40%, or ≥45%, or ≥50%). In some embodiments, base region 30 may include an FeB alloy having about 50% boron (Fe50B). In some embodiments, the FeB alloy may include 50% boron and 50% iron (i.e., 50Fe50B). In some embodiments, base region 30 may include an amorphous material (e.g., an amorphous layer of an FeB (such as, amorphous Fe50B)). However, a base region 30 of an amorphous material is not a requirement. In some embodiments, base region 30 may include a rare earth element, aluminum (Al), titanium (Ti), hafnium (Hf), or zirconium (Zr).

In one embodiment, seed region 40 includes one or more of nickel, chromium, cobalt, iron and alloys thereof—for example, a nickel-chromium alloy which is ion beam sputter deposited on base region 30 comprised of an amorphous alloy (e.g., an FeB alloy with greater than or equal to 50% boron), which is disposed on the surface of first electrode 20. In some embodiments, the content of chromium in seed region 40 may be sufficient to render seed region 40 nonmagnetic. For example, the nickel-chromium alloy of seed region 40 may be greater than or equal to 25 or 30% chromium and less than or equal to 50 or 60% chromium, and preferably, 40% chromium. Notably, the balance of the nickel-chromium alloy of seed region 40, in one embodiment, consists of nickel.

In some embodiments, a spacer region 80 may be provided between free region 70 and second electrode 90. In some embodiments, spacer region 80 may be formed of an electrically conductive non-ferromagnetic material, such as, for example, ruthenium (Ru). In some embodiments, spacer region 80 may include a multi-layer stack, such as, for example, a layer of ruthenium (Ru) and one or more layers of cobalt (Co), iron (Fe), boron (B), or an alloy thereof (e.g., CoFeB). In some embodiments, spacer region 80 may be formed of materials such as tantalum (Ta), tungsten (W), titanium (Ti), tantalum nitride (TaN), etc. In some embodiments, spacer region 80 may include tantalum, a dielectric layer, a dielectric layer and a tantalum layer, or a dielectric layer and a second fixed magnetic region.

For efficient operation of magnetoresistive device 1000, maintaining a low switching voltage and current (i.e., the current required to switch the magnetoresistive bit 100 from one magnetic state to another) is beneficial for the longevity of the device. The quality of the tunnel barrier layer (i.e., intermediate region 60) is an important factor in reducing the switching current. The quality of the intermediate region 60 may be improved by providing a base region 30. In some embodiments, providing a base region 30 that comprises an amorphous material (e.g., an amorphous FeB alloy that forms when boron concentration is greater than or equal to 40%, or 45%, or 50%, etc.) makes the surface of the base region 30 smooth with no clear grain structure. This surface structure of the base region 30 may suppress the columnar growth of the seed region 40 that is formed above the base region 30. This growth structure propagates through the overlying fixed region 50 and improves the quality of the interface between the fixed region 50 and the intermediate region 60. This improved interface quality may improve the efficiency of the MTJ device, for example, by improving time dependent dielectric break down (TDDB), reducing switching voltage, and improving thermal cycling performance.

Figure 2:
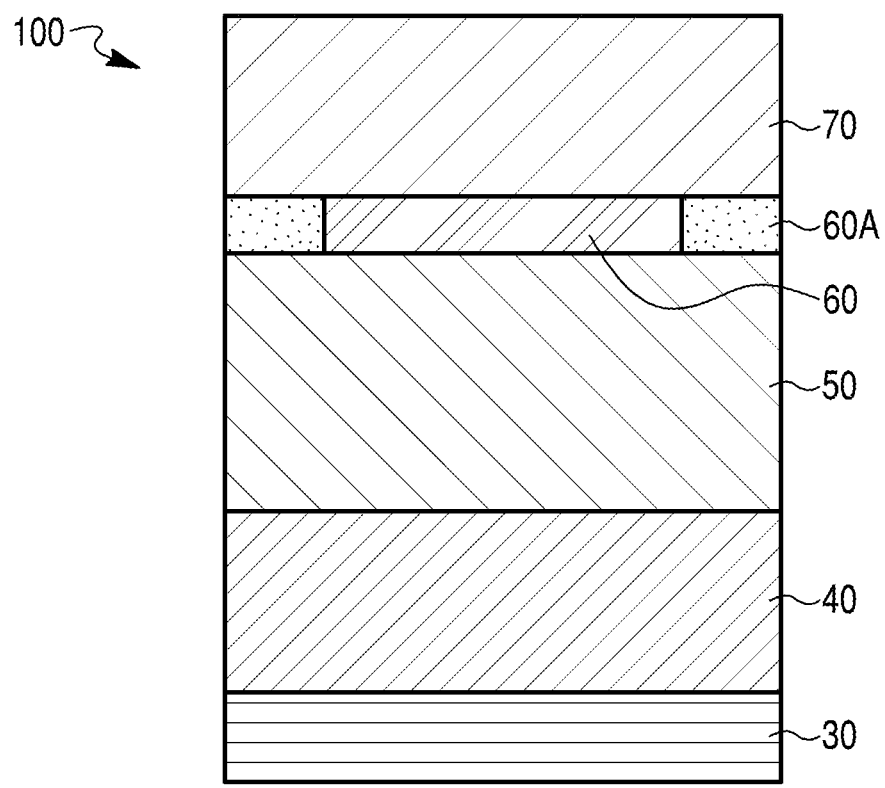
FIG. 2 illustrates a cross-sectional view of a portion of the magnetoresistive stack/structure of FIG. 1.

The base region 30 may also improve the quality of the intermediate region 60 by another independent mechanism. Typically, in an MTJ bit formed from magnetoresistive stack 100, a band of material at the outer edges (or periphery) of the tunnel barrier layer (i.e., intermediate region 60) may have a high electrical resistance due to increased oxidation, etc. FIG. 2 is a schematic illustration of a portion of magnetoresistive stack 100 showing an area of increased oxidation (and therefore increased electrical resistance) on the outer edges of the intermediate region 60. This area of high resistance (marked 60A in FIG. 2A) reduces the area available for electrical conduction. Electrical encroachment is the difference between the physical size (e.g., diameter, area, etc.) of the tunnel barrier layer and the diameter of the reduced electrical conducting area. Increased electrical encroachment reduces efficiency of the magnetoresistive stack 100 by increasing switching voltage and lowering endurance. The base region 30 may also improve performance of the magnetoresistive stack 100 by reducing electrical encroachment.

When base region is formed of (a) an FeB alloy having a boron concentration greater than or equal to 40%, or 45%, or 50%, (b) a rare earth metal, Al, Ti, Hf, and/or Zr and/or (c) an alloy including a rare earth metal, Al, Ti, Hf, and/or Zr, the base region 30 may have a lower standard free energy of oxide formation that an iron rich region that is at the interface between fixed region 50 and intermediate region 60. As is known to a person or ordinary skill in the art, a material that has a lower standard free energy of oxide formation may be oxidized more easily than a material that has a lower standard free energy of oxide formation. Therefore, when base region 30 has a lower standard free energy of oxide formation that the material at the interface between fixed region 50 and the intermediate region 60, the material of the base region 30 may, for example, be more easily oxidized than the interfacial region. Providing a base region 30 that has a lower standard free energy of oxide formation that the material (e.g., CoFeB alloy) at the interface between fixed region 50 and the intermediate region 60 may make it harder for the intermediate region 60 to oxidize and thus suppress or reduce electrical encroachment (e.g., reduce area 60A of FIG. 1). Reducing electrical encroachment may lower the switching voltage (Vc) of the magnetoresistive stack 100 and improve the endurance properties of the magnetoresistive stack 100.

Figure 3A:
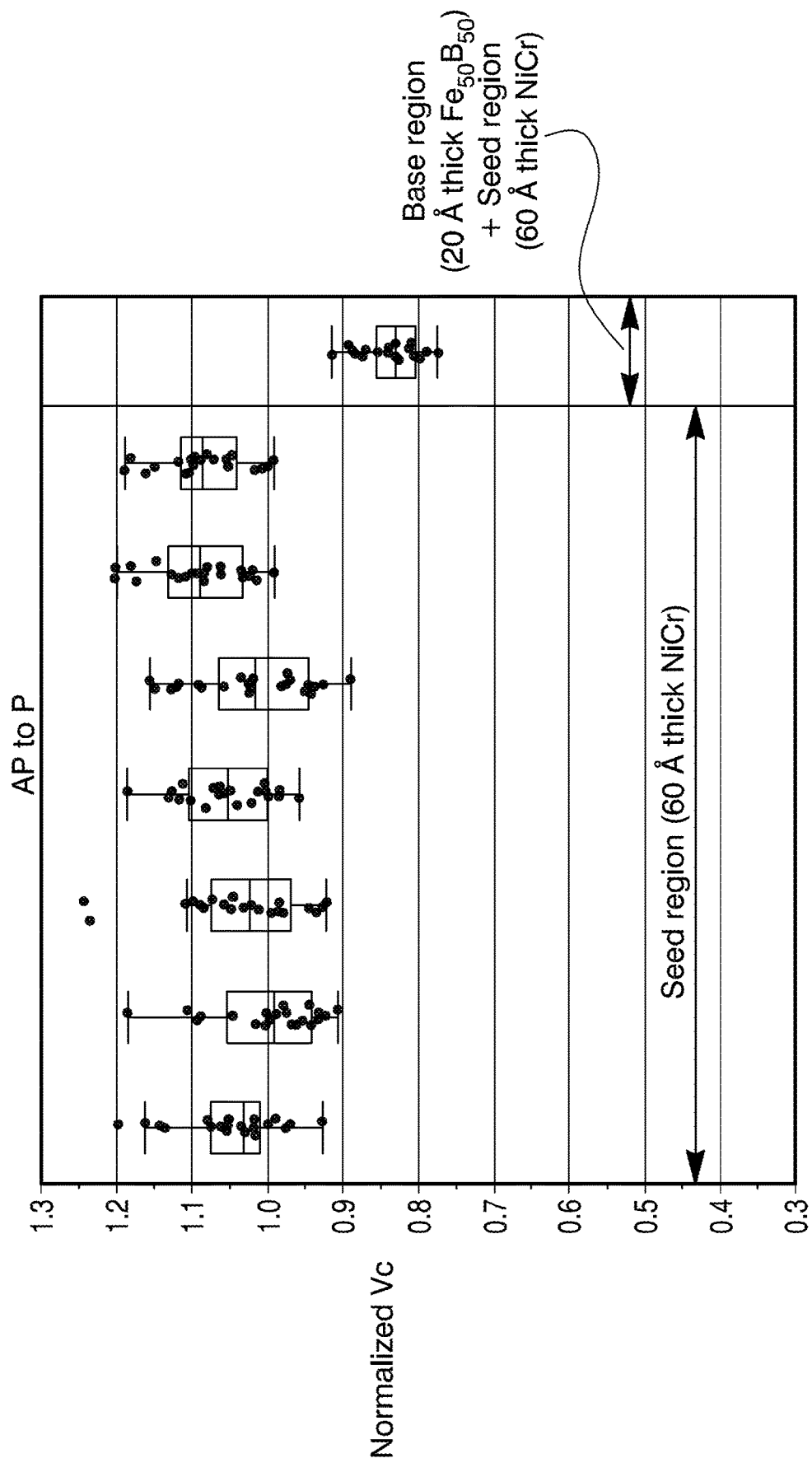
FIGS. 3A and 3B compares the experimental switching voltages of exemplary magnetoresistive stacks of the current disclosure.
Figure 3B:
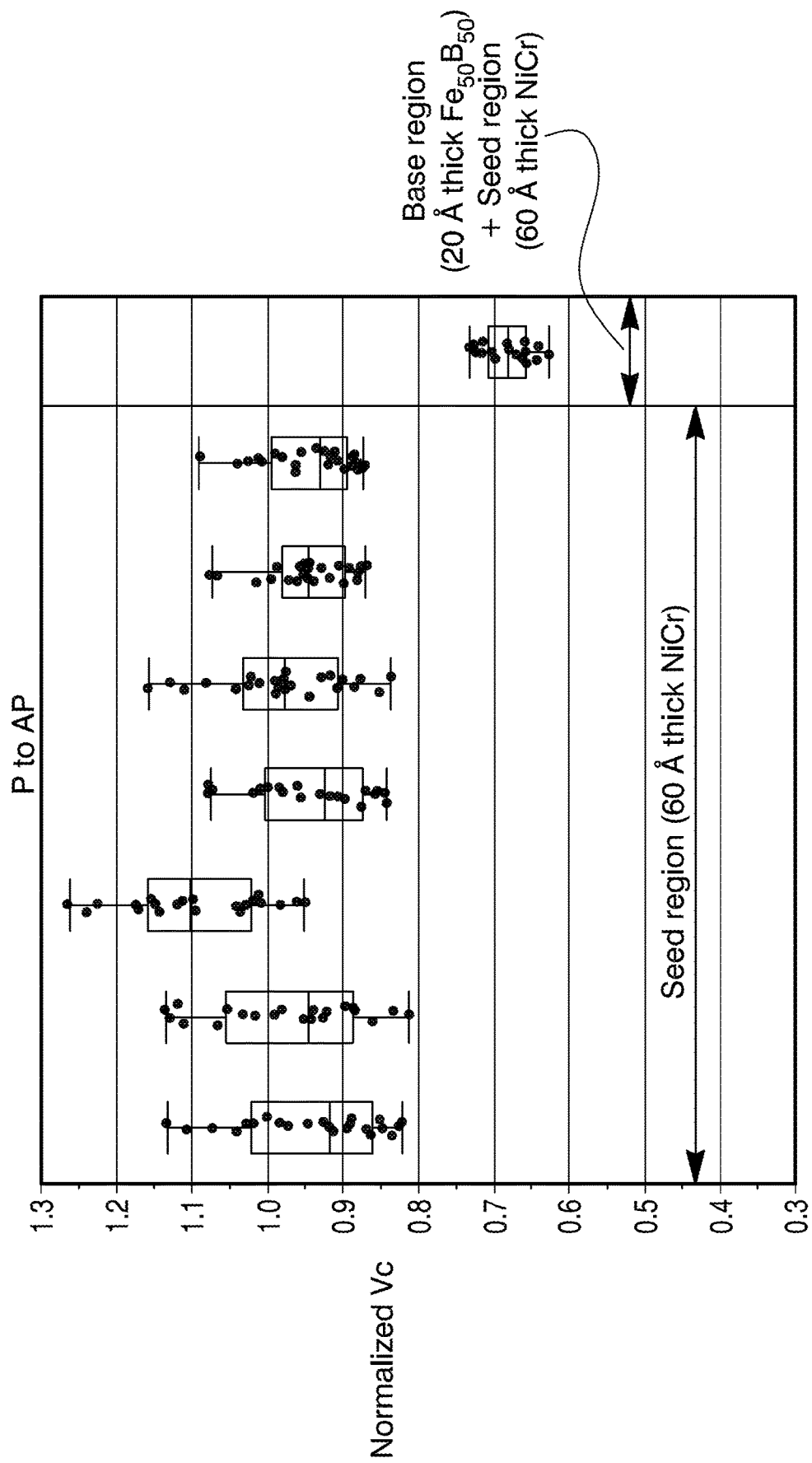

FIGS. 3A and 3B illustrate experimental results comparing the normalized values of switching voltage (Vc) of different magnetoresistive stacks with and without a base region made of an FeB alloy. FIG. 3A is the normalized value of switching voltage for AP-P switching and FIG. 3B is the observed switching voltage for P-AP switching. The x-axis of both figures represent different wafers having different magnetoresistive stacks (materials, thicknesses, etc.). In these studies the actual size of an MTJ was about 70 nanometer (nm), with a nominal size of about 55 nm. As identified in FIGS. 3A and 3B, some of the magnetoresistive stacks had a 60 Å seed layer 40 (see FIG. 1) of a nickel chromium alloy (NiCr) and no base region 30. And, some of these magnetoresistive stacks had a 20 Å thick base region 30 of an amorphous Fe50B alloy (an FeB alloy with a boron concentration of 50%) and a 40 Å thick seed region 40 of NiCr. As can be seen in FIGS. 3A and 3B, providing the base region of an amorphous FeB alloy decreases the switching voltage of the magnetoresistive stacks.

Although, fixed and free regions 50, 70 of FIG. 1 are illustrated as a single layer, this is only exemplary. In some embodiments, one or both of fixed and free regions 50, 70 may include a plurality of the layer(s) of magnetic or ferromagnetic material(s). For example, these ferromagnetic materials may include one or more of the ferromagnetic elements nickel (Ni), iron (Fe), and cobalt (Co), including, for example, alloys or engineered materials with one or more of the elements palladium (Pd), platinum (Pt), magnesium (Mg), manganese (Mn), and chromium (Cr)) as well as one or more synthetic antiferromagnetic structures (SAF) or synthetic ferromagnetic structures (SyF). In some embodiments, one or more layers of magnetic materials layers may also include one or more non-magnetic materials layers (for example, ruthenium (Ru), copper (Cu), aluminum (Al), tantalum (Ta), titanium (Ti), niobium (Nb), vanadium (V), zirconium (Zr), iridium (Ir) and one or more alloys thereof, and in certain embodiments, tungsten (W) and molybdenum (Mo)).

FIG. 4A is a portion of another MTJ type magnetoresistive stack 100A of the current disclosure where the free region has a synthetic antiferromagnetic structure (SAF). In FIG. 4A, layers or regions of the stack above intermediate region 60 (not shown) may be similar to those in FIG. 1. As explained with reference to FIG. 1, magnetoresistive stack 100A includes an intermediate region 60 sandwiched between a fixed region 50 and a free region 70 (not shown). A fixed region 50A is disposed on seed region 40 that is disposed on base region 30. As explained with reference to FIG. 1, in some embodiments, base region 30 may include, for example, an FeB alloy where the concentration of boron is greater than or equal to 40%, 45% or 50%. Additionally or alternatively, in some embodiments, base region 30 may include a rare earth element, aluminum (Al), titanium (Ti), hafnium (Hf), or zirconium (Zr). In some embodiments, base region 30 may be an amorphous alloy (e.g., FeB alloy with boron greater than or equal to 40%, 45% or 50%).

With reference to FIG. 4A, fixed region 50A may have a multi-layer SAF structure that includes a first and a second ferromagnetic regions 52A, 52B (referred to as AP1 and AP2) coupled together by a coupling layer 54. First and a second ferromagnetic regions 52A, 52B may include one or more of the ferromagnetic elements nickel (Ni), iron (Fe), and cobalt (Co), including alloys or engineered materials with one or more of the elements palladium (Pd), platinum (Pt), nickel (Ni), and alloys thereof, and coupling layer 54 may be an antiferromagnetic (AF) coupling layer that includes non-ferromagnetic materials such as, for example, iridium (Ir), ruthenium (Ru), rhenium (Re), or rhodium (Rh). In some embodiments, one or both of ferromagnetic regions 52A, 52B may comprise a magnetic multi-layer structure that includes a plurality of layers of a first ferromagnetic material (e.g., cobalt (Co)) and a second ferromagnetic material (e.g., nickel (Ni)) or a paramagnetic material (e.g., platinum (Pt)). An exemplary multi-layer structure for ferromagnetic regions 52A, 52B is described in Provisional Application No. 62/671,794, filed May 15, 2018. In some embodiments, ferromagnetic regions 52A, 52B may also include, for example, alloys or engineered materials with one or more of palladium (Pd), platinum (Pt), magnesium (Mg), manganese (Mn), and chromium (Cr).

A transition region 56 and a reference region 58 may be disposed between second ferromagnetic region 52B (AP2) and intermediate region 60. In general, transition region 56 may comprise a non-magnetic or a weakly magnetic material and reference region 58 may comprise a ferromagnetic material. In some embodiments, transition and/or reference regions 56, 58 may include one or more layers of material that, among other things, facilitate/improve growth of the overlying intermediate region 60 during fabrication. In some embodiments, transition region 56 may include a non-ferromagnetic transition metal such as tantalum (Ta), titanium (Ti), tungsten (W), ruthenium (Ru), niobium (Nb), zirconium (Zr), and/or molybdenum (Mo). And, reference region 58 may comprise one or more (e.g., all) of cobalt (Co), iron (Fe), and boron (B) (such as, for example, an alloy Co, Fe, and B (CFB)). In some embodiments, transition region 56 and or reference region 58 may include multiple layers stacked one above the other. In general, transition region 56 and reference region 58 may have any thickness. In some embodiments, the thickness reference region 58 may be 6-13 Å, preferably 8-12 Å, and more preferably 7-10 Å, and the thickness of transition region 56 may be 1-8 Å, preferably 2-5 Å, and more preferably 2.5-3.5 Å. It should be noted that, in some embodiments, both transition region 56 and reference region 58 may be provided in fixed region 50A, while in other embodiments, reference region 58 may be eliminated.

In some embodiments, reference region 58 includes cobalt, iron, cobalt and iron (e.g., as an alloy or multilayer). In some embodiments, the reference region 58 may also include boron or tantalum (as an alloy or multilayer). In some embodiments, the transition region 56 and/or the reference region 58 may include an iron boron alloy (i.e., an FeB alloy). For example, in some embodiments, reference region 58 may be a ferromagnetic alloy of cobalt, iron, and boron (referred to as CoFeB or simply CFB), and transition region 56 may be an FeB alloy. In some embodiments, transition region 56 may consist of an amorphous FeB alloy. In general, the concentration of boron in the FeB alloy of transition region 56 may be such that the alloy has a weakly magnetic or non-magnetic (e.g., non-ferromagnetic) behavior. In some such embodiments, the concentration of boron in the FeB alloy of transition region 56 may be between 30-60% or between 30-50%. In some embodiments, the concentration of boron in transition region 56 may be greater than or equal to 40%, or greater than or equal to 45%. In some embodiments, the concentration of boron in the FeB alloy of transition region 56 may be greater than or equal to 50% (and ≤60%).

In another embodiment, the transition region 56 may include tantalum (Ta) and the reference region 58 may include an FeB alloy. In some such embodiments, the FeB alloy of reference region 58 may be an amorphous alloy. In general, the concentration of boron in the FeB alloy of reference region 58 may be such that the resulting alloy has a ferromagnetic behavior. For example, in one embodiment, the concentration of iron in the FeB alloy of reference region 58 may be greater than or equal to 50%, and/or the concentration of boron may be less than or equal to 40% and preferably less than or equal to 30%. In some embodiments, the concentration of boron in the FeB alloy of reference region 58 may be less than 50%, less than or equal to 40%, or less than or equal to 30%.

In some embodiments, both transition region 56 and reference region 58 may include a FeB alloy. In such embodiments, the concentration of boron in the FeB alloy of transition region 56 is such that the alloy has a weakly magnetic or non-magnetic behavior, and the concentration of boron in the FeB alloy of reference region 58 is such that the resulting alloy has a ferromagnetic behavior. Typically, when both transition and reference region 56, 58 include FeB alloys, the concentration of boron in the FeB alloys of the transition and reference regions 56, 58 may be different.

In general, the concentration of boron in the FeB alloy of reference region 58 will be less than the concentration of boron in the FeB alloy of transition region 58. Reference region 58 may include a single layer of an FeB alloy, or multiple layers (that includes one or more layers of FeB alloys along with layers of other materials) stacked above the another. For example, in some embodiments, reference region 58 may include layers of one or more of CoFeB, CoFe, and or Fe, along with one or more layers of an FeB alloy. In some embodiments, reference region 58 may include a rare earth element, aluminum (Al), titanium (Ti), hafnium (Hf), or zirconium (Zr) or an alloy of a rare earth element, aluminum (Al), titanium (Ti), hafnium (Hf), or zirconium (Zr).

In some embodiments, the FeB alloy of the reference region 58 may be deposited as an FeB alloy or a multilayer structure including a layer or an FeB alloy. For example, in some embodiments, the reference region 58 may include a layer of an FeB alloy and one or more of a layer of a CoFeB alloy, a layer of a CoFe alloy, a layer of Co, and a layer of Fe. These layers may be deposited in any order. For example, in some embodiments, a multilayer reference region 58 may include a layer of, for example, a CoFe alloy deposited over a layer of an FeB alloy (i.e., CoFe layer is positioned between the layer of FeB alloy and the intermediate region 60). In some embodiments, the layer or the FeB alloy may be deposited over the layer of CoFe alloy. In some embodiments, when deposited as a multilayer structure, after deposition of the materials and after further/final processing (e.g., after annealing), the layer of iron and the layer of boron may mix to form a FeB alloy of the desired boron concentration. When deposited as a multilayer structure, the concentration and/or thickness of the boron layers in the multilayer structure of the reference region 58 may render this layer ferromagnetic. The materials of the transition and reference regions 56, 58 may also mix with materials of adjoining regions at their interfaces. For example, when reference region 58 is deposited as a multilayer, the resulting alloy (after mixing) may result in a high-iron alloy interface region (for example, an iron rich alloy (CoFe of CoFeX where X may be nickel and/or one or more non-magnetic materials such as one or more transition metals or boron)) within the reference region 58 which is adjacent to and/or in contact with intermediate region 60. In one embodiment, the high-iron alloy interface region, at the interface of intermediate region 60, is greater than or equal to 50% iron.

With continuing reference to FIG. 4A, after forming free region 50A, one or more layers of a dielectric material (e.g., MgO, $Al_xO_y$) may then be deposited on fixed region 50A to form intermediate region 60. Intermediate region 60 forms the tunnel barrier region of the magnetoresistive stack 100A. Intermediate region 60 may be formed by any now-known or future-developed method. In some embodiments, the one or more dielectric layers of intermediate region 60 may be formed as described in U.S. Pat. Nos. 8,686,484 and 9,136,464. In some embodiments, as illustrated in FIG. 4A, magnetoresistive stack 100A may include all of base region 30, transition region 56, and reference region 58. And, some or all of these regions may include an FeB alloy. For example, base region 30 may include an FeB alloy (e.g., an amorphous FeB alloy) where the concentration of boron is greater than or equal to 50% (or ≥45%, or ≥40%). And, transition region 56 may include an FeB alloy with the concentration of boron selected to create a weakly magnetic or non-magnetic FeB alloy, and reference region 58 may include an FeB alloy with the concentration of boron selected to create a ferromagnetic alloy. In some embodiments, transition 56 region may consist essentially of an FeB alloy. In some such embodiments, the boron concentration in the transition region 56 may be between 30-60% (or ≥40%, or ≥45%, or ≥50%), and boron concentration in the reference region 58 may be less than that in the transition region 56 (such as, for example, ≤40%, or ≤30%). Additionally or alternatively, in some embodiments, base region 30 and/or reference region 58 may include a rare earth element, aluminum (Al), titanium (Ti), hafnium (Hf), or zirconium (Zr) or an alloy of some or all of these materials.

In some embodiments (e.g., in some embodiments where the transition region 56 and/or the reference region 58 includes an FeB alloy), the base region 30 may be eliminated. That is, in some embodiments, only transition region 56 and/or reference region 58 may include an FeB alloy. FIG. 4B illustrates a cross-section view of a portion of an MTJ-type magnetoresistive stack 100B without a base region 30. Similar to magnetoresistive stack 100A of FIG. 4A, magnetoresistive stack 100B of FIG. 4B includes an exemplary fixed region 50A, a reference region 58, and a transition region 56. Fixed region 50A may be a fixed, unpinned SAF including a first multi-layer structure (AP1) (first ferromagnetic region 52A) which is antiferromagnetically coupled to a second multi-layer structure (AP2) (second ferromagnetic region 52B) via a coupling layer 54. In some embodiments, each multi-layer structure may include a plurality of layers of magnetic or ferromagnetic material(s) (for example, materials that include one or more of the ferromagnetic elements nickel (Ni), iron (Fe), and cobalt (Co), including alloys or engineered materials with one or more of the elements palladium (Pd), platinum (Pt), chromium (Cr) and alloys thereof). And, the coupling layer 54 may include one or more non-magnetic materials (for example, ruthenium (Ru), iridium (Ir) or rhodium (Rh)). In some embodiments, the reference region 58 may include one or more or all of cobalt, iron and boron (for example, in an alloy—such as an amorphous alloy (e.g., CoFeB) and the transition region 56 may include a non-ferromagnetic transition metal such as tantalum, titanium, tungsten and/or molybdenum. In some embodiments, the reference region 58 may include a layer of iron (for example, deposited as pure or substantially pure iron) and a layer of cobalt, iron and boron (for example, deposited as an alloy) wherein, after further/final processing (e.g., after annealing), the layer of iron at the interface may form a continuous atomic layer or may mix with the underlying ferromagnetic alloy in the final annealed structure, resulting in a high-iron interface region within the reference region 58 which is adjacent to intermediate region 60. In another embodiment, the transition region 56 is an iron boron (FeB) alloy such that the concentration of boron provides a weakly magnetic or non-ferromagnetic layer (for example, the concentration of boron is greater than or equal to 40% or 45% and preferably greater than or equal to 50%) and/or the reference region 58 includes cobalt, iron, cobalt and iron (e.g., as an alloy or multilayer) which may also include a boron or tantalum (as an alloy or multilayer) (for example, a ferromagnetic reference region of an FeB alloy wherein the boron concentration is less than or equal to 40% and preferably less or equal to than 30%).

With reference to FIGS. 4A and 4B, transition and reference regions 56, 58 formed of an FeB alloy (or a rare earth element, aluminum (Al), titanium (Ti), hafnium (Hf), or zirconium (Zr) or an alloy of some or all of these materials) may improve the quality of the intermediate region by mechanisms similar to those previously described with reference to the base region 30. For example, such transition and/or reference regions 56, 58 may improve the grain structure of the overlying intermediate region 60 by suppressing the columnar growth of the overlying regions. The transition and/or reference regions 56, 58 formed of an FeB alloy (or a rare earth element, aluminum (Al), titanium (Ti), hafnium (Hf), or zirconium (Zr) or an alloy of some or all of these materials) may also have lower standard free energy of oxide formation than the material at the interface between the fixed region 50A and the intermediate region 60 and thus decrease electrical encroachment. For the sake of brevity, such discussion in will not be repeated but is incorporated here by reference. It should be noted that the structure of the fixed region described herein is only exemplary and many variations are possible. For example, U.S. Provisional Patent Application No. 62/711,918, filed on Jul. 30, 2018, incorporated by reference herein in its entirety, discloses exemplary fixed region stack/structures that may be used.

Figure 5:
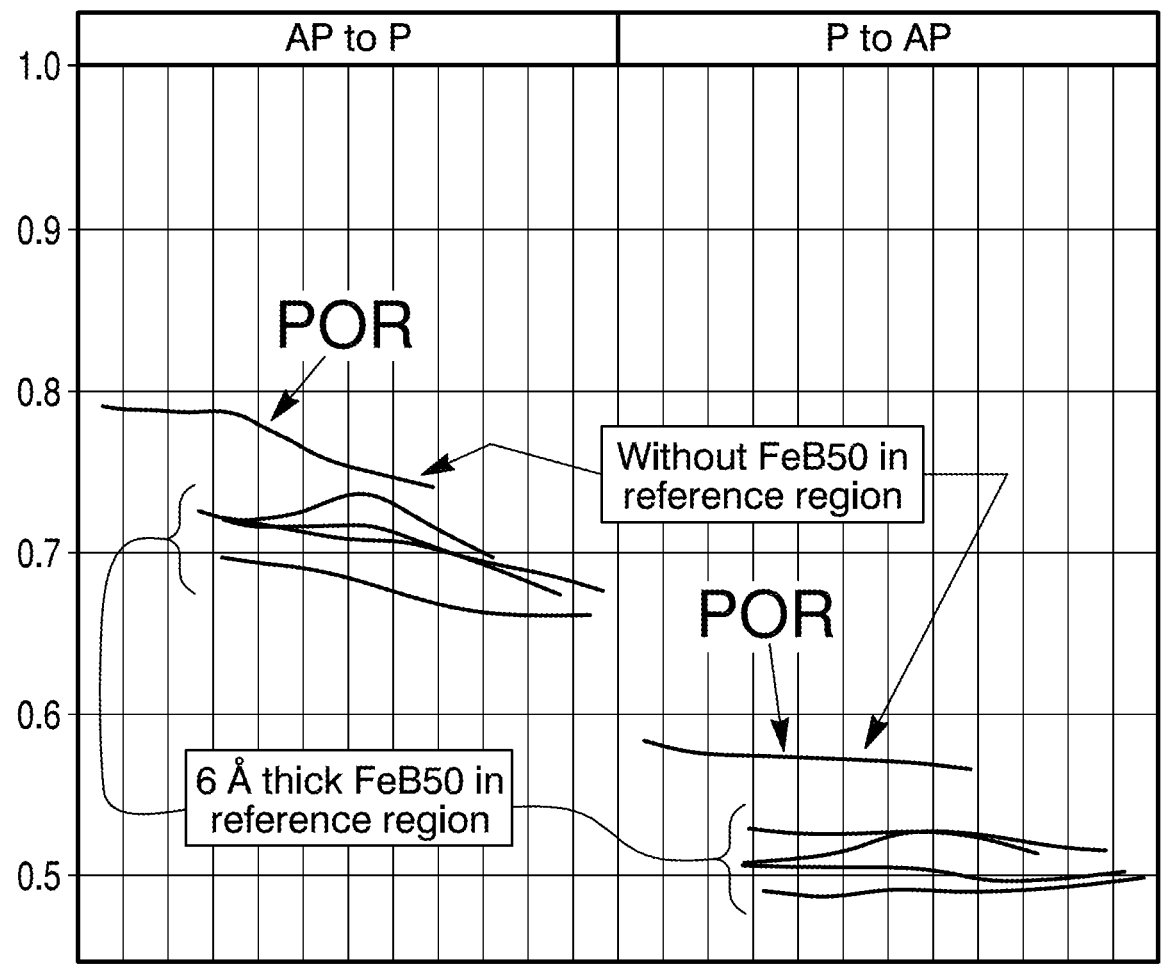
FIG. 5 compares the experimental switching voltages of exemplary magnetoresistive stacks of the current disclosure.

FIG. 5 illustrates experimental results comparing the switching voltage (Vc) of different magnetoresistive stacks with and without a reference region that includes an FeB alloy. In FIG. 5, the curves on the left side show the switching voltage for AP-P switching and the curves on the right side show the switching voltage for P-AP switching. The x-axis of FIG. 5 represent the cross-sectional area (or MTJ diameter) of the magnetoresistive stacks and the different curves represent different thicknesses and materials of the transition and reference regions 56, 58 (see FIG. 4) of the magnetoresistive stacks. All the magnetoresistive stacks included a tantalum (Ta) transition region 56. One of the magnetoresistive stacks (identified as POR in FIG. 5) included an 8.6 Å thick reference region 58 made of an iron cobalt boron alloy (CoFeB) and all the other magnetoresistive stacks included a composite reference region 58 made of a 6 Å thick FeB alloy and a 4 Å thick CoFe alloy. As can be seen in FIG. 5, providing an FeB alloy in the reference region 58 decreases both the AP-P and P-AP switching voltage of the magnetoresistive stacks.

With renewed reference to FIG. 1, free region 70 may include any ferromagnetic alloy. In some embodiments, the ferromagnetic alloy of free region 70 may comprise cobalt (Co), iron (Fe), and boron (B) (referred to as CoFeB or CFB). It should be noted that the configuration of free region 70 illustrated in FIG. 1 is only exemplary, and many other configurations are possible. Notwithstanding the specific configuration of free region 70, as explained previously, a magnetic vector (or moment) in free region 70 may be moved or switched by applied magnetic fields or spin torque currents. Although free region 70 is illustrated as a single layer in FIG. 1, this is only exemplary. Similar to fixed region 50, free region 70 may also include multiple layers stacked one over the other. For example, free region 70 may include at least two ferromagnetic layers separated by an insertion layer that provides ferromagnetic or antiferromagnetic coupling between the ferromagnetic layers on either side. The insertion layer may include, for example, tantalum (Ta), tungsten (W), molybdenum (Mo), ruthenium (Ru), rhodium (Rh), rhenium (Re), iridium (Ir), chromium (Cr), osmium (Os), and combinations thereof. In general, the ferromagnetic layers and the insertion layer may have any thickness. Typically, the thickness of the insertion layer is chosen to provide strong ferromagnetic or antiferromagnetic coupling between the two ferromagnetic layers on either side. In some embodiments, the thickness of the insertion layer may be chosen such that it does not form a continuous layer, which would break or otherwise inhibit the exchange coupling between the two ferromagnetic layers on either side. Instead, the material of the insertion layer may mix with the materials of the ferromagnetic layers on either side to form a uniform layer. U.S. Pat. No. 8,686,484 describes an exemplary configuration of free region 70.

Figure 6:
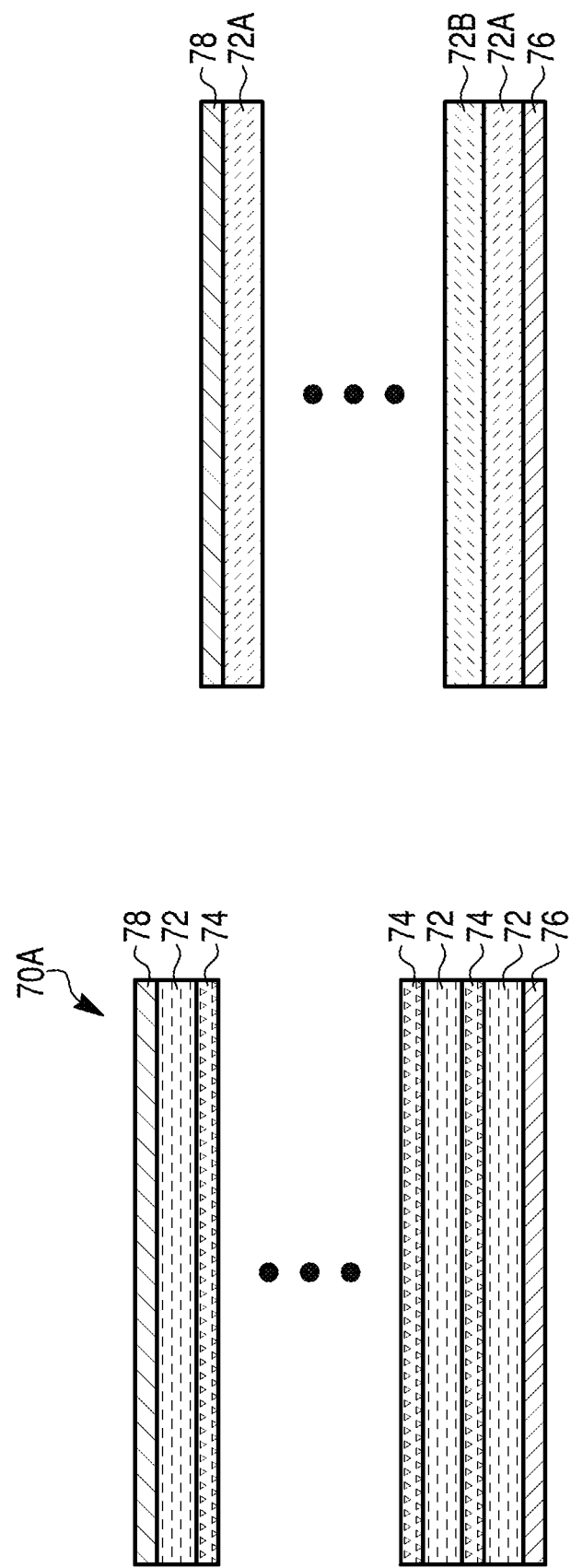
FIGS. 6A and 6B illustrate cross-sectional views of exemplary "free" magnetic regions of the magnetoresistive stack/structure of FIG. 1.

FIG. 6A illustrates a cross-sectional view of an exemplary free region 70A having a plurality of ferromagnetic layers 72 coupled together by insertion layers 74. The ferromagnetic layers 72 may include, for example, cobalt, iron, boron, nickel and/or one or more alloys thereof such as a cobalt-iron alloy or a cobalt-iron-boron (CoFeB) alloy. Insertion layer 74 may include, for example, one or more non-ferromagnetic transition metals, such as tantalum, niobium, vanadium, zirconium, molybdenum or ruthenium and/or one or more alloys thereof. In some embodiments, as illustrated in FIG. 6A, free region 70A includes alternating ferromagnetic layers 72 and insertion layers 74. After formation of free region 70A, a portion of the ferromagnetic layer 72 in contact with intermediate region 30 alloys with and forms a ferromagnetic interface region 76 at the interface of free region 70A and intermediate region 30. Similarly, a portion of the ferromagnetic layer 72 in contact with spacer region 80 alloys with and forms a ferromagnetic interface region 78 at the interface of free region 70A and spacer region 80. Thus, as illustrated in FIG. 6A, the alternating ferromagnetic layer 72 and insertion layer 74 structure is disposed between ferromagnetic interface regions 76, 78.

FIG. 6B illustrates a cross-sectional view of another exemplary free region 70B. Free region 70B includes an alternating structure of multiple ferromagnetic materials 72A, 72B deposited one above the other. The ferromagnetic materials 72A, 72B may include, for example, cobalt, iron, nickel and/or one or more alloys thereof such as a cobalt-iron alloy or a cobalt-iron-boron alloy. Compared to free region 70A, free region 70B does not include one or more insertion layers in an alternating ferromagnetic layer—insertion layer structure. However, in some embodiments, not all insertion layers are omitted. Similar to free region 70A of FIG. 6A, free region 70B also includes ferromagnetic interface regions 76, 78 (for example, iron or an iron alloy) which interface with and/or contact intermediate region 60 (i.e., tunnel barrier of the magnetoresistive stack) and spacer region 80 (which may also be a tunnel barrier in some embodiments).

With reference to FIGS. 6A and 6B, in some embodiments, the ferromagnetic interface regions 76, 78 comprise iron or an iron alloy. In one embodiment, the ferromagnetic interface regions 76, 78 include at least 50% iron (hereinafter "high-iron interface regions"). U.S. Pat. No. 8,686,484 describes exemplary ferromagnetic interface regions. Notably, the high-iron interface regions 76, 78 may include a continuous layer of iron (for example, pure iron), a discontinuous layer of iron, and/or an interfacial layer of high-iron alloy (wherein the alloy includes greater than or equal to 50% iron). In one embodiment, the high-iron interface regions 76, 78 provides at least an atomic layer of material at the surface of free region 70A, 70B having mainly iron atoms. Notably, the high-iron interface regions 76, 78 may provide, among other things, high perpendicular interface anisotropy energy.

With renewed reference to FIG. 1, after forming the free region 70, the spacer region 80 and the second electrode 90 may be formed. In some embodiments, the spacer region 80 may be a non-magnetic region that provides a barrier between the free region 70 and the electrically conductive material of the second electrode 90. U.S. Pat. No. 8,686,484 describes an exemplary spacer region. In some embodiments, one or more dielectric layers are deposited on free region 70 followed by spacer region 80 and second electrode 90. In such embodiments, the one or more second dielectric layers, may provide, among other things, an additional barrier between the free region 70 and the electrically conductive material of second electrode 90. In yet another embodiment, one or more dielectric layers are deposited on free region 70 followed by a second fixed region 50 thereby forming multiple MTJs (e.g., dual spin filter MTJ). A spacer region may or may not be disposed above the second fixed region. The electrically conductive material of second electrode 90 may be used to provide electrical contact to the magnetoresistive stack 100.

Figure 7:
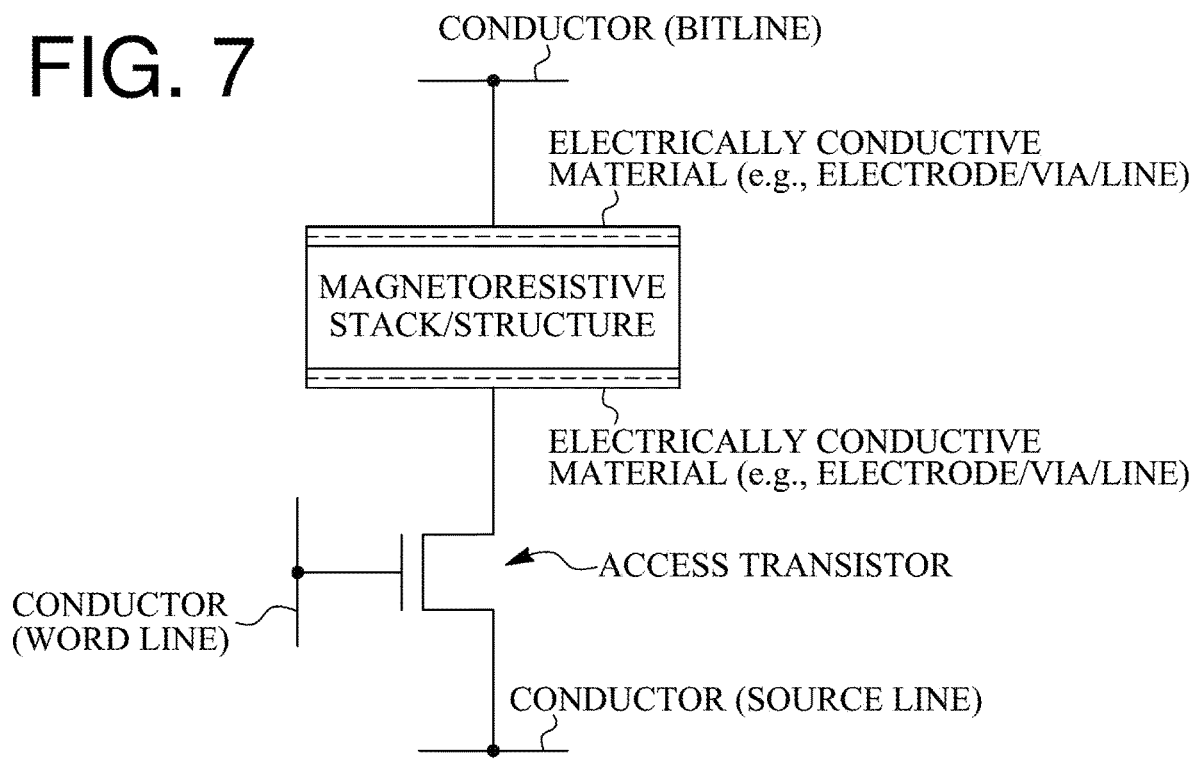
FIG. 7 is an exemplary schematic diagram of a magnetoresistive memory stack/structure electrically connected to an access transistor in a magnetoresistive memory cell configuration.
Figure 8A:
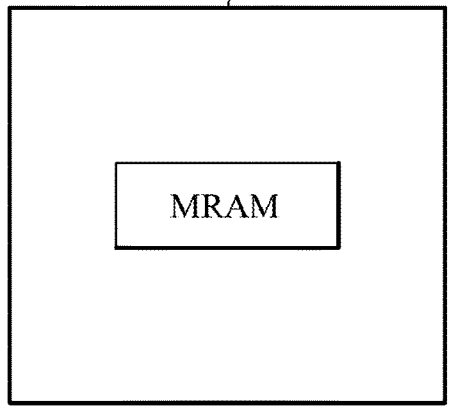
FIGS. 8A and 8B are schematic block diagrams of integrated circuits including discrete memory device and an embedded memory device, each including MRAM (which, in one embodiment is representative of one or more arrays of MRAM having a plurality of magnetoresistive memory stacks/structures according to according to certain aspects of certain embodiments of the present inventions.
Figure 8B:
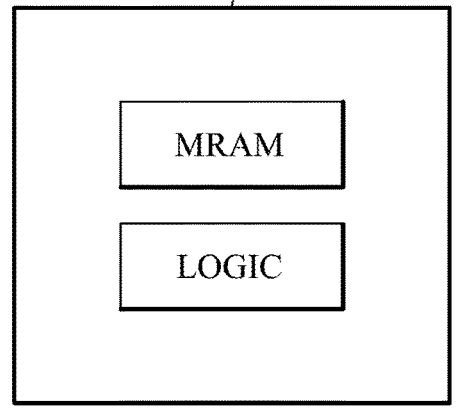

As alluded to above, the MTJ type magnetoresistive devices 1000 (formed using magnetoresistive stacks 100, 100A, 100B) may include a sensor architecture or a memory architecture (among other architectures). For example, in a magnetoresistive device having a memory configuration, the MTJs may be electrically connected to an access transistor and configured to couple or connect to various conductors, which may carry one or more control signals, as shown in FIG. 7. The magnetoresistive devices 1000 may be used in any suitable application, including, e.g., in a memory configuration. In such instances, the magnetoresistive devices 1000 may be formed as integrated circuits comprising a discrete memory device (e.g., as shown in FIG. 8A) or an embedded memory device having a logic therein (e.g., as shown in FIG. 8B), each including MRAM, which, in one embodiment is representative of one or more arrays of MRAM having a plurality of magnetoresistive stacks/structures, according to certain aspects of certain embodiments disclosed herein.

With reference to FIG. 1, magnetoresistive stack 100 may be fabricated using any process technique now known or later developed, for example, using conventional deposition and lithographic techniques. For the sake of brevity, conventional techniques related to semiconductor processing are not described in detail herein. The fabrication of integrated circuits, microelectronic devices, micro electro mechanical devices, microfluidic devices, and photonic devices involves the creation of several layers or regions (i.e., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer (or material) not protected by the remaining resist is patterned. Alternatively, an additive process can be used in which a structure is built up using the photoresist as a template.

Figure 9:
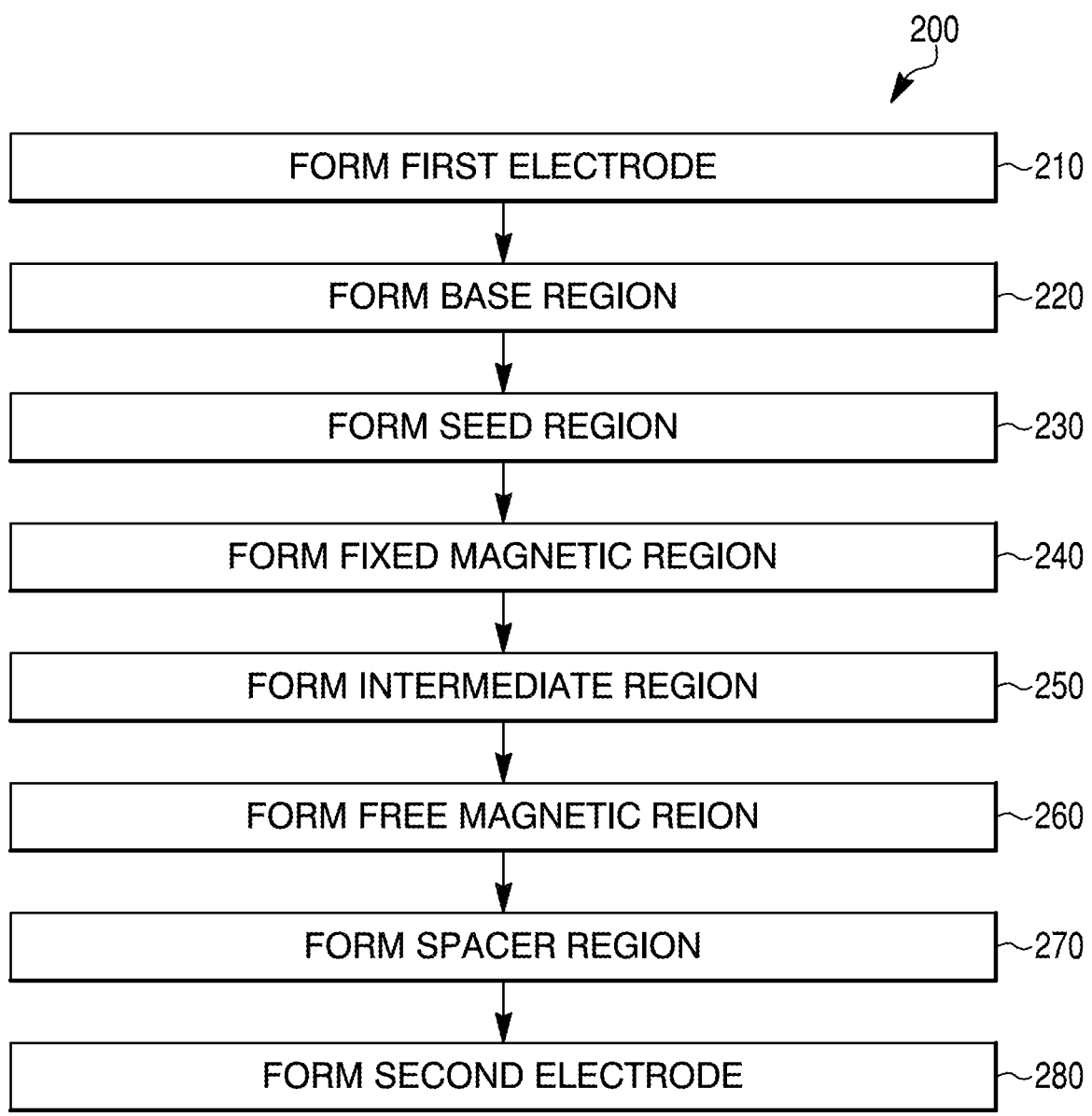
FIG. 9 is a flow chart showing an exemplary manufacturing flow for the MTJ-type magnetoresistive stack/structure of FIG. 1.

FIG. 9 is a flow chart that illustrates an exemplary method 200 of forming a magnetoresistive device 1000 having a magnetoresistive stack (e.g., stack 100 of FIG. 1). As described in further detail below, fabricating the magnetoresistive stack 100 includes sequentially depositing, growing, sputtering, evaporating, and/or providing (as noted above, herein collectively "forming" or other verb tense (e.g., "form," "forming," etc.)) the different regions (e.g., regions 20-90) that form the magnetoresistive stack 100 on the surface of semiconductor substrate 10 which, after further processing (for example, etching, encapsulating, etc.) forms the magnetoresistive stack 100. Prior to depositing the different regions on the substrate 10, CMOS processing may first be carried out on the substrate 10. CMOS processing may include forming transistors and/or other integrated circuit devices on the substrate 10, interconnecting the transistors and devices in a desired pattern to form CMOS circuits, and forming metallization (bond pads, etc.) on an exposed surface of the substrate 10 to access these CMOS circuits. Magnetoresistive stack 100 may then be formed on the surface of substrate 10. Forming the magnetoresistive stack may include sequentially depositing (and/or growing, sputtering, etc.) the multiple regions of the magnetoresistive stack 100. Any now-known (e.g., chemical vapor deposition, sputter deposition, etc.) or future developed process of depositing materials may be used to form the magnetoresistive stack 100.

First electrode 20 may first be formed on or above substrate 10 (step 210). First electrode 20 may be formed by depositing the electrically conductive material that forms first electrode 20 on substrate 10. The material of the base region 30 may then be deposited on or over the first electrode 20 (step 220). In some embodiments, depositing base region 30 may include depositing an alloy including iron and boron (FeB alloy) on the first electrode 20. In some embodiments, the FeB alloy may include a boron concentration greater than or equal to 50%. In some embodiments, the boron concentration may be greater than or equal to 45% or 40%. In some embodiments, step 220 may include depositing an amorphous layer of an FeB alloy (where B≥50%, or ≥45%, or ≥40%). In some embodiments, instead of directly depositing a FeB alloy on first electrode 10, step 220 may include depositing a layer of iron and a layer of boron one on top of another (in either order). The thickness of the individual iron and boron layers may be selected such that, after the two material alloy together (during subsequent annealing, etc.) to form an FeB alloy, the concentration of the boron in the alloy is ≥50%, or ≥45%, or ≥45%. In some embodiments, in addition to or alternative to depositing an FeB alloy (either directly as an alloy or as individual Fe and B layers), step 220 may include depositing a rare earth element, aluminum (Al), titanium (Ti), hafnium (Hf), or zirconium (Zr) (or an alloy that includes a rare earth metal, aluminum, titanium, hafnium, or zirconium) on or above first electrode 20 to form base region 30.

The materials that form seed region 40 may then be deposited on or above base region 30 (step 230). In some embodiments, depositing seed region 40 may include depositing an alloy of nickel and chromium on base region 30. The content of nickel and chromium in the alloy may be such that the formed seed region 40 is non-magnetic. In some embodiments, the content of chromium in the alloy is 30-50%, and preferably 40%. The materials that form the fixed region 50 may then be deposited on seed region 40 (step 240). In embodiments where fixed region 50 includes multi-layer stack (see FIGS. 4A and 4B), step 240 may include sequentially depositing the different regions that form the multi-layer fixed region 50. The material that forms intermediate region 60 may then be formed on fixed region 50 (step 250). In some embodiments, forming the intermediate region 60 may include depositing one or more layers of an oxide, such as, for example, magnesium oxide (MgO) or aluminum oxide ($Al_xO_y$). In some embodiments, intermediate region 60 may be formed by multiple steps of material deposition and oxidation. For example, in some embodiments, step 250 may include depositing one or more layers of an oxidizable material (e.g., magnesium (Mg), aluminum (Al), etc.) and then oxidizing (e.g., by plasma oxidation, natural oxidation, etc.) the deposited material to form an oxide (magnesium oxide (MgO), aluminum oxide ($Al_xO_y$)). In some embodiments, multiple such deposition and oxidation steps may be carried out to produce an intermediate region 60 of the desired thickness.

The materials that form the free region 70 is deposited on or above intermediate region 60 (step 260). In embodiments where free region 70 includes multi-layer stack (see FIGS. 6A and 6B), step 260 may include sequentially depositing the different regions that form the multi-layer free region 70. The materials that form spacer region 80 is then deposited over free region 70 (step 270). In some embodiments, step 270 may include depositing one or more layers of an electrically conductive non-ferromagnetic material (such as, for example, ruthenium (Ru)). In some embodiments, step 270 may include depositing a multi-layer stack, such as, for example, a layer of ruthenium (Ru) and one or more layers of cobalt (Co), iron (Fe), boron (B), or an alloy thereof (e.g., CoFeB). In some embodiments, step 270 may include sequentially forming a second intermediate region (e.g., depositing a dielectric material (e.g., MgO, $Al_xO_y$, etc.)) and the above-described materials of spacer region (Ru, Co, Fe, B, CoFeB, etc.) on free region 70. In some embodiments, step 270 may include sequentially forming a second intermediate region and a second fixed region (that may be similar to fixed region 50) on free region 70.

The electrically conductive material(s) that form the second electrode 90 may then be deposited on or above spacer region 80. The formed magnetoresistive stack 100 may be annealed. As known to those of ordinary skill in the art, annealing the magnetoresistive stack 100 may set the magnetic domains of different regions of the magnetoresistive stack 100 in the desired directions. Annealing may be performed by exposing the substrate 10 with the magnetoresistive stack 100 formed thereon to a high temperature (e.g., ≥300° C., or between about 300-500° C., etc.). In some embodiments, the magnetoresistive stack 100 may also be subject to a magnetic field during the annealing. Although not shown in FIG. 9 or discussed in detail herein, the formed magnetoresistive stack 100 may then be patterned by, for example, etching through the different regions to form a plurality of MTJ bits and interconnecting the MTJ bits to form an MTJ device (e.g., MTJ device 1000 of FIG. 1).

Figure 10:
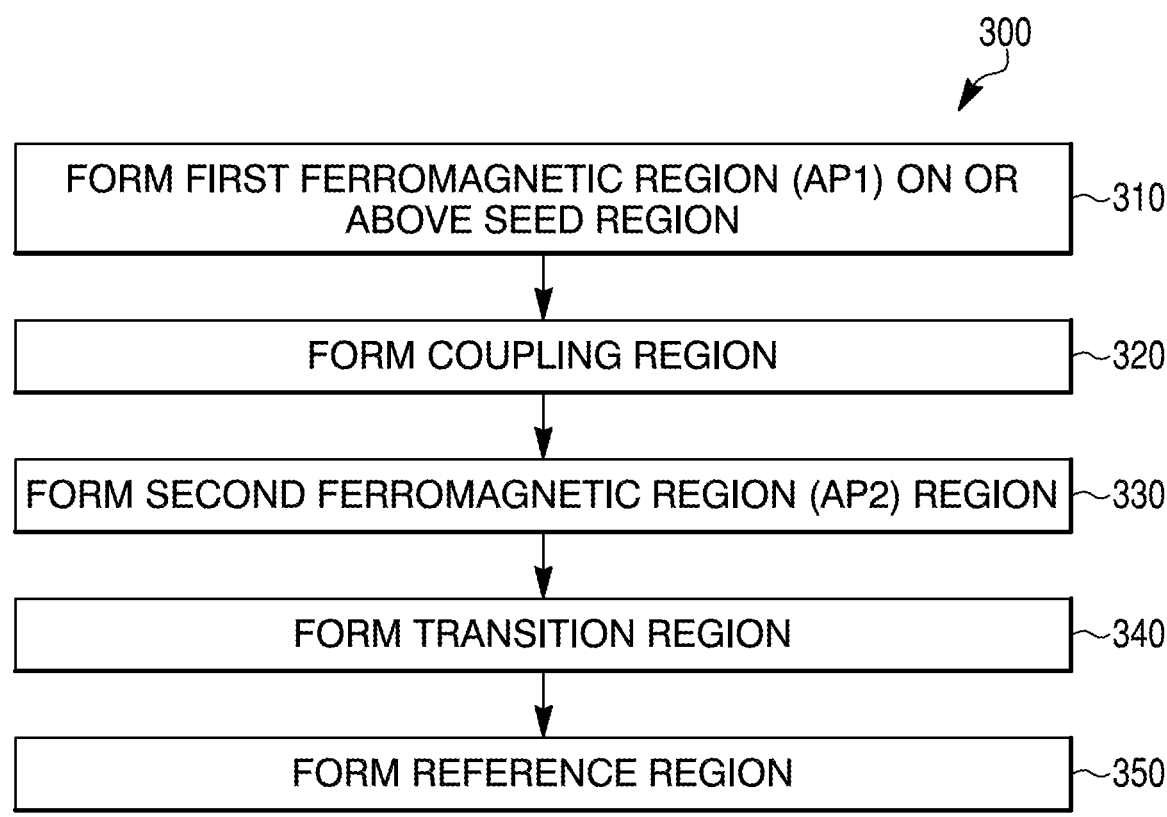
FIG. 10 is a flow chart showing an exemplary manufacturing flow for an exemplary "fixed" magnetic region of the MTJ-type magnetoresistive stack/structure of FIG. 1.

As explained above, in embodiments where fixed region 50 includes multi-layer stack, step 240 of FIG. 9 includes sequentially depositing the different regions that form the multi-layer fixed region 50. FIG. 10 is a flow chart that illustrates an exemplary method 300 of forming a multi-layer fixed region (e.g., fixed region 50A of FIG. 4A). The materials that form the first ferromagnetic region 52A (AP1) is deposited on seed region 40 (step 310). The material of the coupling layer 54 is deposited on ferromagnetic region 52A (step 320), and the materials of the second ferromagnetic region 52B (AP2) is then deposited on the coupling layer 54 (step 330). The material(s) of the transition region 56 is deposited on or above the second ferromagnetic region 52B (step 340), and the material(s) of the reference region 58 is then deposited in the transition region 56 (step 350).

In some embodiments, depositing the transition region 56 (step 340) includes depositing a layer of tantalum (Ta) that is non-magnetic or weakly magnetic, and depositing the reference region (step 350) includes depositing a ferromagnetic alloy of cobalt, iron, and boron (CoFeB). In some embodiments, depositing the transition region 56 (step 340)

includes depositing an alloy of iron and boron (FeB alloy) wherein the concentration of boron in the alloy makes the alloy non-magnetic or weakly magnetic (e.g., boron concentration ≥45%, preferably ≥50%, etc.), and depositing the reference region (step 350) includes depositing a ferromagnetic alloy of cobalt, iron, and boron (CoFeB). In some embodiments, depositing the transition region 56 (step 340) includes depositing a layer of tantalum (Ta) that is non-magnetic or weakly magnetic, and depositing the reference region (step 350) includes depositing an FeB alloy wherein the concentration of boron in the alloy makes the alloy ferromagnetic (e.g., boron concentration ≤40%, preferably ≤30%). In some embodiments, depositing the transition region 56 (step 340) includes depositing an FeB alloy wherein the concentration of boron in the alloy makes the alloy non-magnetic or weakly magnetic (e.g., boron concentration ≥45%, preferably ≥50%, etc.), and depositing the reference region (step 350) includes depositing an FeB alloy wherein the concentration of boron in the alloy makes the alloy ferromagnetic (e.g., boron concentration ≤40%, preferably ≤30%). In some embodiments, depositing the reference region (step 350) includes depositing a rare earth element, aluminum (Al), titanium (Ti), hafnium (Hf), or zirconium (Zr) (or an alloy that includes a rare earth metal, aluminum, titanium, hafnium, or zirconium).

With reference to FIGS. 9 and 10, in some embodiments (e.g., where the transition region 56 and/or the reference region includes an FeB alloy or a rare earth element, aluminum (Al), titanium (Ti), hafnium (Hf), or zirconium (Zr) (or an alloy that includes a rare earth metal, aluminum, titanium, hafnium, or zirconium)), the step of depositing base region (step 220 of FIG. 7) may be eliminated). In some embodiments, depositing the reference region (step 350) includes depositing, for example, (1) an alloy including of (i) cobalt and iron, or (ii) cobalt, iron and boron, and/or (2) cobalt, and/or (3) iron, and/or (4) a multilayer of one or more of (1), (2) and (3).

There are many embodiments described and illustrated herein. While certain embodiments, features, attributes and advantages have been described and illustrated, it should be understood that many others, as well as different and/or similar embodiments, features, attributes and advantages are apparent from the description and illustrations. As such, the above embodiments are merely exemplary. They are not intended to be exhaustive or to limit the disclosure to the precise forms, techniques, materials and/or configurations disclosed. Many modifications and variations are possible in light of this disclosure. It is to be understood that other embodiments may be utilized and operational changes may be made without departing from the scope of the present disclosure. As such, the scope of the disclosure is not limited solely to the description above because the description of the above embodiments has been presented for the purposes of illustration and description.

Indeed, the present disclosure are neither limited to any single aspect nor embodiment thereof, nor to any combinations and/or permutations of such aspects and/or embodiments. Moreover, each of the features of a disclosed embodiment may be employed alone or in combination with one or more features of other embodiments.

Many modifications, variations, combinations and/or permutations are possible in light of the above teaching. For example, although certain exemplary techniques are described and/or illustrated above in the context of MTJ-based magnetoresistive stacks/structures, as noted above, aspects of the present disclosure may be implemented in GMR-based magnetoresistive stacks (for example, sensor and memory). For the sake of brevity such discussions/illustrations will not be repeated in the context of GMR-based magnetoresistive stacks/structures having amorphous alloy region, transition layer and/or reference layer of the present inventions—but it is to be interpreted as entirely applicable to GMR-based stacks/structures where a conductor (rather than a dielectric material in the case of MTJ-based stacks) is disposed between magnetic materials.

Further, in one exemplary embodiment, the free magnetic region includes a plurality of ferromagnetic materials and/or layers (for example, including materials such as cobalt, iron, boron, nickel and/or one or more alloys thereof such as a cobalt-iron alloy or a cobalt-iron-boron alloy) but does not include a plurality of insertion layers in an alternating ferromagnetic layer—insertion layer structure (see, FIG. 6B). Albeit, in another embodiment, one or more insertion layers are included and not omitted from the free magnetic region. Moreover, the free magnetic region may omit one or both of the ferromagnetic interface regions (for example, for example, iron or an iron alloy) which interface with and/or contact the dielectric layer (i.e., tunnel barrier of the magnetoresistive stack) and the spacer region.

In addition, the magnetoresistive stack of the present inventions may be implemented in a sensor architecture or a memory architecture (among other architectures). For example, in a memory configuration, the magnetoresistive memory stack may be electrically connected to an access transistor and configured to be coupled or connect to various conductors (which carry one or more control signals) (see, FIG. 7). In one embodiment, a plurality of magnetoresistive memory stacks may be fabricated and/or incorporated on an integrated circuit, for example, in an MRAM array. (See, FIGS. 8A and 8B).

The alloys described and illustrated herein may be formed using any technique now known or later developed. For example, a nickel-chrome alloy may be formed via co-deposition (for example, via sputtering and/or evaporating of a nickel-chrome alloy or via concurrently and separately sputtering and/or evaporating nickel and chromium). In addition thereto, or in lieu thereof, sequentially depositing materials, together with one or more annealing processes, may be employed to form the alloys. Again, any technique now known or later developed may be used to form the alloys described and illustrated herein.

The fixed, unpinned SAF region may include two multi-layer structures (AP1 and AP2—for example, like that of the magnetic multi-layer structure of FIG. 4A). In another embodiment, the fixed, unpinned SAF region may include only one multi-layer structure (either AP2 or AP1) and a non-multi-layer structure (the other of AP2 or AP1). Here, the magnetic multi-layer structure and a non-multi-layer structure are antiferromagnetically coupled via a coupling layer. The multi-layer structure (AP1 or AP2) may include any particular structure or architecture (and be manufactured) consistent with any of the embodiment described and/or illustrated herein.

Further, as mentioned above, in one embodiment, the fixed magnetic region includes multi-layer structures (AP1 or AP2) and a transition region and a reference region disposed between AP2 and the intermediate region (e.g., dielectric layer that forms the tunnel barrier). Here, the transition region may include one or more layers of material that facilitate/improve growth of the dielectric layer during fabrication. In one embodiment, the reference region and/or transition region are as described above. In another embodiment, the reference region may include one or more or all of cobalt, iron, and boron (for example, in an alloy—such as an amorphous alloy (e.g., CoFe or CoFeB) and/or the transition region may include a non-ferromagnetic transition metal such as tantalum, titanium, tungsten and/or molybdenum. Moreover, in another embodiment, the reference region may include a layer of iron (for example, deposited as pure or substantially pure iron) and a layer of (i) cobalt and iron or (ii) cobalt, iron and boron (for example, deposited as an alloy) wherein, after further/final processing (e.g., after annealing), the layer of iron at the interface may form a continuous atomic layer or may mix with the underlying ferromagnetic alloy in the final annealed structure, resulting in a high-iron alloy interface region (for example, greater than or equal to 50% iron by age) within the reference layer which is adjacent to the dielectric layer and/or the concentration of boron is less than or equal to 40% and preferable less than or equal to 30%. Notably, all permutations and combinations of the reference layer, transition layer and other aspects of the magnetoresistive stack are intended to fall within the scope of the present inventions.

Notably, while the magnetic materials layer(s) and magnetic materials of the magnetoresistive stack are illustrated as a single layer, the magnetic materials layer(s) and magnetic materials may include a number of different layers of both magnetic and nonmagnetic material. For example, the layers may include multiple layers of magnetic material, dielectric layers that provide, for example, one or more diffusion barriers, coupling layers between layers of magnetic material that provide for ferromagnetic or antiferromagnetic coupling, antiferromagnetic material. For example, one of the magnetic material layer(s) may include a set of layers forming a SAF and a layer of antiferromagnetic material, amorphous alloy region, seeding layers, diffusion layers as well as non-contiguous layers of magnetic and nonmagnetic material. The other magnetic material layer(s) may include a set of layers corresponding to a SyF, amorphous alloy region, seeding layers, spacing layers, diffusion layers as well as non-contiguous layers of magnetic and nonmagnetic material. Notably, each of the layers shown to be included in the magnetoresistive device may be a composite layer that includes multiple sub-layers. Other embodiments may include multiple SAFs, SyFs, and tunnel barriers in addition to the other layers, where the materials and structures are arranged in various combinations and permutations now known or later developed.

For example, one or more regions (for example, the fixed magnetic region) of the magnetoresistive stack (for example, a magnetoresistive memory stack or a magnetoresistive sensor/transducer stack) may include and/or consist of a SyF. For example, the fixed magnetic region may be a pinned or unpinned SyF including, for example, a multi-layer SyF a plurality of layers of one or more magnetic or ferromagnetic materials separated by an ferromagnetic coupling layer (for example, an coupling layer including ruthenium or rhodium having a thickness that provides ferromagnetic coupling). Such a SyF may be deposited or formed on the seed region which is disposed on the amorphous alloy region. Notably, all of the inventions described and/or illustrated herein may be implemented in conjunction with a pinned or unpinned SyF embodiment; however, for the sake of brevity, such combinations and permutations will not be described/illustrated separately herein.

Further, the one or more layers of magnetic materials (for example, nickel, iron, cobalt, and alloys thereof) may be etched, formed and/or patterned using any etchants and/or technique now known or later developed—for example, using mechanical and/or chemical techniques (for example, an ion beam etching, low bias power sputter technique or a chemical etch technique (such as a conventional fluorine and/or chlorine based etch technique)). Where the magnetic material stack includes one or more SAFs or SyFs, the one or more layers of magnetic materials layers may also include one or more non-magnetic materials layers (for example, copper, aluminum or non-ferromagnetic transition metals, such as tantalum, niobium, vanadium, zirconium, molybdenum or ruthenium). Notably, one or more magnetic material stack may include SAF and SyF structures, one or more layers of magnetic materials, and other materials (including magnetic and/or non-magnetic) now known or later developed. Such materials and/or structures may be arranged in any combination or permutation now known or later developed.

The MTJ-based magnetoresistive stack may include out-of-plane magnetic anisotropy or in-plane magnetic anisotropy. The present disclosure is applicable to all forms or types of magnetoresistive stacks and structures. Moreover, the free magnetic region may be disposed on the magnetic tunnel barrier or beneath the magnetic tunnel barrier; the fixed magnetic region would be disposed on and interface a side of the magnetic tunnel barrier which is opposite to the side that interfaces the free magnetic region.

Further, although the exemplary embodiments are described and/or illustrated in the context of MTJ stacks and structures having a free magnetic region disposed above the tunnel barrier and the fixed magnetic region disposed below the tunnel barrier, the present inventions may be implemented wherein the fixed magnetic region is disposed above the tunnel barrier and the free magnetic region disposed below the tunnel barrier. In this embodiment, the free magnetic region is formed on (and in contact with) the seed region. For the sake of brevity, the embodiment where the free magnetic region is formed on and in contact with the seed region will not be separately illustrated—but these inventions are to be interpreted as entirely applicable to such embodiments where the free magnetic region is formed and disposed on the seed region (rather than formed and disposed on a dielectric material in the case of MTJ stacks/structures). As such, in one embodiment, the magnetoresistive stack includes an out-of-plane magnetic anisotropy (for example, perpendicular magnetic anisotropy) where a pinned or unpinned fixed magnetic region is disposed on or above one or more layer(s) of dielectric material, which is disposed on or above a free magnetic region wherein the free magnetic region is disposed on and in contact with the seed region (which may be disposed on and in contact with amorphous alloy region which is disposed on one or more layers of electrically conductive materials.

In one aspect, a magnetoresistive stack is disclosed. The magnetoresistive stack may include a base region including a material having a lower standard free energy of oxidation than iron and a seed region formed on the base region. A fixed magnetic region may be formed above the seed region, an intermediate region formed above the fixed magnetic region, and a free magnetic region formed above the intermediate region.

Various embodiments of the disclosed magnetoresistive stack may alternatively or additionally include one or more of the following aspects: the material of the base region may include an amorphous alloy of iron and boron; the material of the base region may include an iron boron alloy having boron concentration greater than or equal to 45 atomic percent; the material of the base region may include an iron boron alloy having boron concentration greater than or equal to 50 atomic percent; the material of the base region may include at least one of (a) a rare earth material, (b) aluminum, (c) titanium, (d) hafnium, (e) zirconium, or (f) an alloy of aluminum, titanium, hafnium, or zirconium; the base region may have a thickness of about 10-40 Å; the base region may have a thickness of about 20 Å; the fixed magnetic region may have a synthetic antiferromagnetic structure (SAF) and include a reference region and a transition region, wherein the reference region is positioned between the transition region and the intermediate region, and wherein the reference region includes a ferromagnetic alloy of iron and boron; the fixed magnetic region may have a synthetic antiferromagnetic structure (SAF) and includes a reference region and a transition region, wherein the reference region is positioned between the transition region and the intermediate region, and wherein the reference region includes at least one of (a) a rare earth material, (b) aluminum, (c) titanium, (d) hafnium, (e) zirconium, or (f) an alloy of aluminum, titanium, hafnium, or zirconium; the fixed magnetic region may have a synthetic antiferromagnetic structure (SAF) and include a reference region and a transition region, wherein the reference region is positioned between the transition region and the intermediate region, and wherein the transition region includes a non-ferromagnetic alloy of iron and boron; the fixed magnetic region may have a synthetic antiferromagnetic structure (SAF) and includes a reference region and a transition region, wherein (a) the reference region is positioned between the transition region and the intermediate region, (b) the transition region includes a non-ferromagnetic alloy of iron and boron and/or the reference region includes a ferromagnetic alloy of iron and boron, and (c) a thickness of the transition region is about 2-5 Å and a thickness of the reference region is about 7-10 Å; and the seed region may include an alloy of nickel and chromium.

In another aspect, a magnetoresistive stack is disclosed. The magnetoresistive stack may include a base region, a seed region formed on the base region, a fixed magnetic region formed above the seed region. The fixed magnetic region may have a synthetic antiferromagnetic structure (SAF) and include a reference region and a transition region. An intermediate region may be formed above the fixed magnetic region. The reference region may be positioned between the transition region and the intermediate region. And, a free magnetic region may be formed above the intermediate region. At least one of the base region, the transition region, and the reference region may include a material having a lower standard free energy of oxidation than iron.

Various embodiments of the disclosed magnetoresistive stack may alternatively or additionally include one or more of the following aspects: the base region may include an amorphous alloy of iron and boron having a boron concentration greater than or equal to about 45 atomic percent; the base region may include at least one of (a) rare earth material, (b) aluminum, (c) titanium, (d) hafnium, (e) zirconium, or (f) an alloy of aluminum, titanium, hafnium, or zirconium; the reference region may include a ferromagnetic alloy of iron and boron; the reference region may include an alloy of iron and boron having a boron concentration less than or equal to about 30 atomic percent; the reference region may include least one of (a) rare earth material, (b) aluminum, (c) titanium, (d) hafnium, (e) zirconium, or (f) an alloy of aluminum, titanium, hafnium, or zirconium; the transition region may include a non-ferromagnetic alloy of iron and boron; and the transition region may include an alloy of iron and boron having a boron concentration is about 30-50 atomic percent.

Although the described exemplary embodiments disclosed herein are directed to various magnetoresistive-based devices and methods for making such devices, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions so that those skilled in the art should understand that they can make various changes, substitutions and alterations without departing from the spirit and scope of the inventions in their broadest form.

Notably, reference herein to "one embodiment" or "an embodiment" means that a particular feature, structure, or characteristic described in connection with the embodiment may be included, employed and/or incorporated in one, some or all of the embodiments of the present inventions. The usages or appearances of the phrase "in one embodiment" or "in another embodiment" in the specification are not referring to the same embodiment, nor are separate or alternative embodiments necessarily mutually exclusive of one or more other embodiments, nor limited to a single exclusive embodiment. The same applies to the term "implementation." The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

Further, as indicated above, an embodiment or implementation described herein as "exemplary" is not to be construed as preferred or advantageous, for example, over other embodiments or implementations; rather, it is intended convey or indicate the embodiment or embodiments are example embodiment(s).

The term "ferromagnetic material" means or includes magnetic and/or ferromagnetic materials. As noted above, the term "deposit" (or various forms thereof (e.g., deposited, deposition or depositing)) means or includes deposit, grow, sputter, evaporate, form and/or provide (or various forms thereof). Moreover, values, limits and/or ranges of the atomic composition of, for example, the base region 30, transition region 56 and/or reference region 58 means the value, limit and/or range+/−10%. The term "magnetoresistive stack" means or includes a magnetoresistive stack or magnetoresistive structure, for example, a magnetoresistive memory stack/structure (such as a memory cell in, for example, MRAM or the like) or a magnetoresistive sensor/transducer stack/structure (such as, for example, a read head for hard disk drives or the like).

The terms "comprise," "include," "have" and any variations thereof (for example, "comprising," "including" and "having") are used synonymously to denote or describe non-exclusive inclusion. As such, a process, method, article and/or apparatus that uses such terms to, for example, describe a recipe, configuration and/or contents, does not include only those steps, structures and/or elements but may include other steps, structures and/or elements not expressly identified, listed or inherent to such process, method, article or apparatus.

What is claimed is:

1. A magnetoresistive stack, comprising:
a base region, wherein a material of the base re ion includes an iron boron alloy having boron concentration greater than or equal to 45 atomic percent;
a seed region formed on the base region;
a fixed magnetic region formed above the seed region;
an intermediate region formed above the fixed magnetic region; and
a free magnetic region formed above the intermediate region.

2. The magnetoresistive stack of claim 1, wherein the material of the base region includes an amorphous alloy of iron and boron.

3. The magnetoresistive stack of claim 1, wherein the material of the base region includes an iron boron ahoy having boron concentration greater than or equal to 50 atomic percent.

4. The magnetoresistive stack of claim 1, wherein the material of the base region includes at least one of (a) a rare earth material, (b) aluminum, (c) titanium, (d) hafnium, (e) zirconium, or (f) an alloy of aluminum, titanium, hafnium, or zirconium.

5. The magnetoresistive stack of claim 1, wherein the base region has a thickness of about 10-40 Å.

6. The magnetoresistive stack of claim 1, wherein the base region has a thickness of about 20 Å.

7. The magnetoresistive stack of claim 1, wherein the fixed magnetic region has a synthetic antiferromagnetic structure (SAF) and includes a reference region and a transition region, wherein the reference region is positioned between the transition region and the intermediate region, and wherein the reference region includes a ferromagnetic alloy of iron and boron.

8. The magnetoresistive stack of claim 1, wherein the fixed magnetic region has a synthetic antiferromagnetic structure (SAF) and includes a reference region and a transition region, wherein the reference region is positioned between the transition region and the intermediate region, and wherein the reference region includes at least one of (a) a rare earth material, (b) aluminum, (c) titanium, (d) hafnium, (e) zirconium, or (f) an alloy of aluminum, titanium, hafnium, or zirconium.

9. The magnetoresistive stack of claim 1, wherein the fixed magnetic region has a synthetic antiferromagnetic structure (SAF) and includes a reference region and a transition region, wherein the reference region is positioned between the transition region and the intermediate region, and wherein the transition region includes a non-ferromagnetic alloy of iron and boron.

10. The magnetoresistive stack of claim 1, wherein the fixed magnetic region has a synthetic antiferromagnetic structure (SAF) and includes a reference region and a transition region, wherein (a) the reference region is positioned between the transition region and the intermediate region, (b) the transition region includes a non-ferromagnetic alloy of iron and boron and/or the reference region includes a ferromagnetic alloy of iron and boron, and (c) a thickness of the transition region is about 2-5 Å and a thickness of the reference region is about 7-10 Å.

11. The magnetoresistive stack to claim 1, wherein the seed region includes an alloy of nickel and chromium.

12. A magnetoresistive stack, comprising:
a base region;
a seed region formed on the base region;
a fixed magnetic region formed above the seed region, wherein the fixed magnetic region has a synthetic antiferromagnetic structure (SAF) and includes a reference region and a transition region, wherein the transition region includes a non-ferromagnetic alloy of iron and boron;
an intermediate region formed above the fixed magnetic region, wherein the reference region is positioned between the transition region and the intermediate region; and
a free magnetic region formed above the intermediate region,
wherein at least one of the base region, the transition region, and the reference region includes a material having a lower standard free energy of oxidation than iron.

13. The magnetoresistive stack of claim 12, wherein the base region includes an amorphous alloy of iron and boron having a boron concentration greater than or equal to about 45 atomic percent.

14. The magnetoresistive stack of claim 12, wherein the base region includes at least one of (a) rare earth material, (b) aluminum, (c) titanium, (d) hafnium, (e) zirconium, or (f) an alloy of aluminum; titanium, hafnium; or zirconium.

15. The magnetoresistive stack of claim 12, wherein the reference region includes a ferromagnetic alloy of iron and boron.

16. The magnetoresistive stack of claim 12, wherein the reference region includes an alloy of iron and boron having a boron concentration less than or equal to about 30 atomic percent.

17. The magnetoresistive stack of claim 12, wherein the reference region includes least one of (a) rare earth material, (b) aluminum, (c) titanium, (d) hafnium, (e) zirconium, or (f) an alloy of aluminum, titanium, hafnium, or zirconium.

18. The magnetoresistive stack of claim 12, wherein the transition region includes an alloy of iron and boron having a boron concentration of about 30-50 atomic percent.

* * * * *